US011436399B2

(12) United States Patent
Langhammer et al.

(10) Patent No.: US 11,436,399 B2
(45) Date of Patent: Sep. 6, 2022

(54) METHOD AND APPARATUS FOR PERFORMING MULTIPLIER REGULARIZATION

(71) Applicant: Intel Corporation, Santa Clara, CA (US)

(72) Inventors: Martin Langhammer, Alderbury (GB); Sergey Gribok, Santa Clara, CA (US); Gregg William Baeckler, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 756 days.

(21) Appl. No.: 16/218,179

(22) Filed: Dec. 12, 2018

(65) Prior Publication Data

US 2019/0121927 A1 Apr. 25, 2019

(51) Int. Cl.
*G06F 7/52* (2006.01)
*G06F 30/331* (2020.01)
*H03K 19/17704* (2020.01)
*H03K 19/17736* (2020.01)
*H03K 19/17756* (2020.01)
*H03K 19/17728* (2020.01)

(52) U.S. Cl.
CPC ..... *G06F 30/331* (2020.01); *H03K 19/17712* (2013.01); *H03K 19/17728* (2013.01); *H03K 19/17736* (2013.01); *H03K 19/17756* (2013.01)

(58) Field of Classification Search
CPC ............ G06F 30/331; H03K 19/17712; H03K 19/17728; H03K 19/17736; H03K 19/17756
See application file for complete search history.

(56) References Cited

U.S. PATENT DOCUMENTS

| | | | | |
|---|---|---|---|---|
| 5,506,799 A | * | 4/1996 | Nakao | ................... G06F 7/5338 708/628 |
| 7,269,616 B2 | * | 9/2007 | Rupp | ........................ G06F 7/57 708/625 |
| 9,002,915 B1 | * | 4/2015 | Young | .............. H03K 19/17736 708/209 |
| 2019/0303748 A1 | * | 10/2019 | Hah | ........................ G06F 7/465 |
| 2020/0136643 A1 | * | 4/2020 | Shekhar | ............... H03M 7/6011 |

* cited by examiner

*Primary Examiner* — Kurtis R Bahr

(57) ABSTRACT

A method for implementing a multiplier on a programmable logic device (PLD) is disclosed. Partial product bits of the multiplier are identified and how the partial product bits are to be summed to generate a final product from a multiplier and multiplicand are determined. Chains of PLD cells and cells in the chains of PLD cells for generating and summing the partial product bits are assigned. It is determined whether a bit in an assigned cell in an assigned chain of PLD cells is under-utilized. In response to determining that a bit is under-utilized, the assigning of the chains of PLD cells and cells for generating and summing the partial product bits are changed to improve an overall utilization of the chains of PLD cells and cells in the chains of PLD cells.

24 Claims, 38 Drawing Sheets

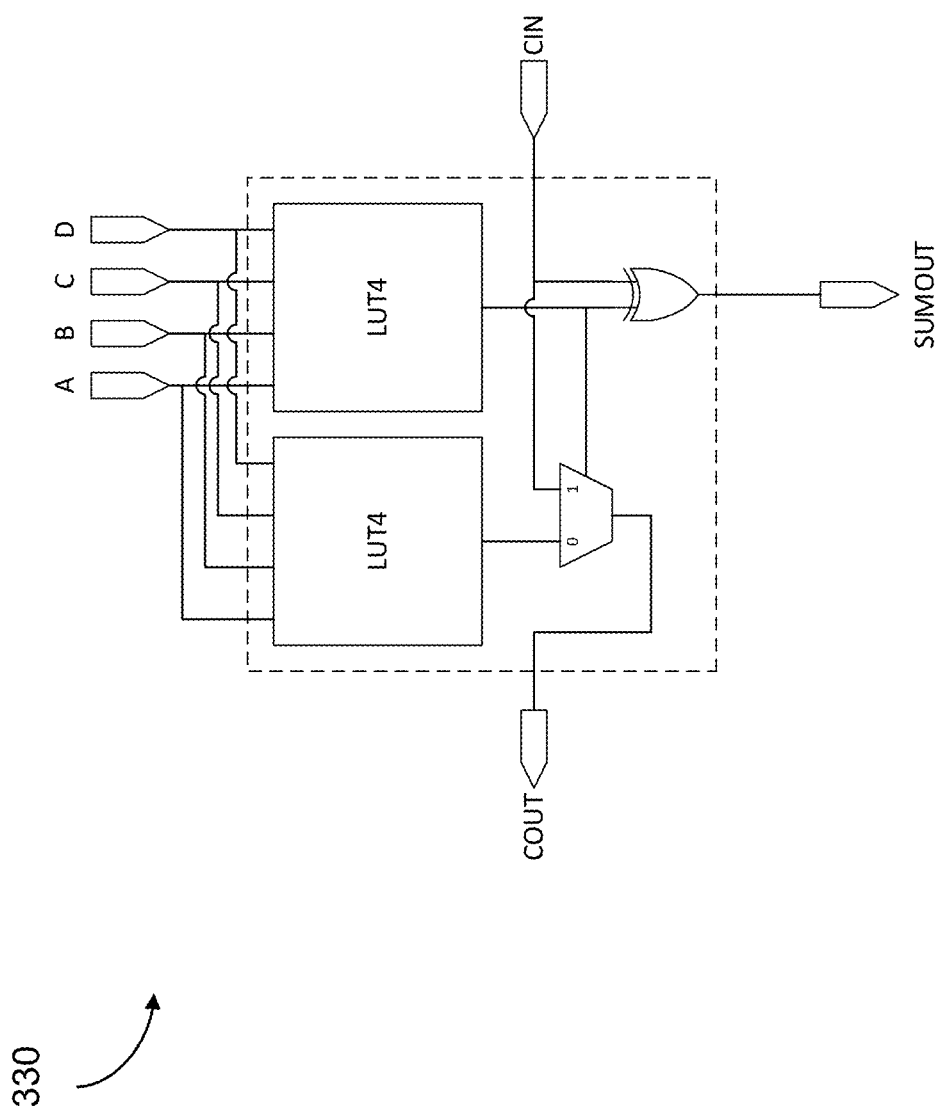

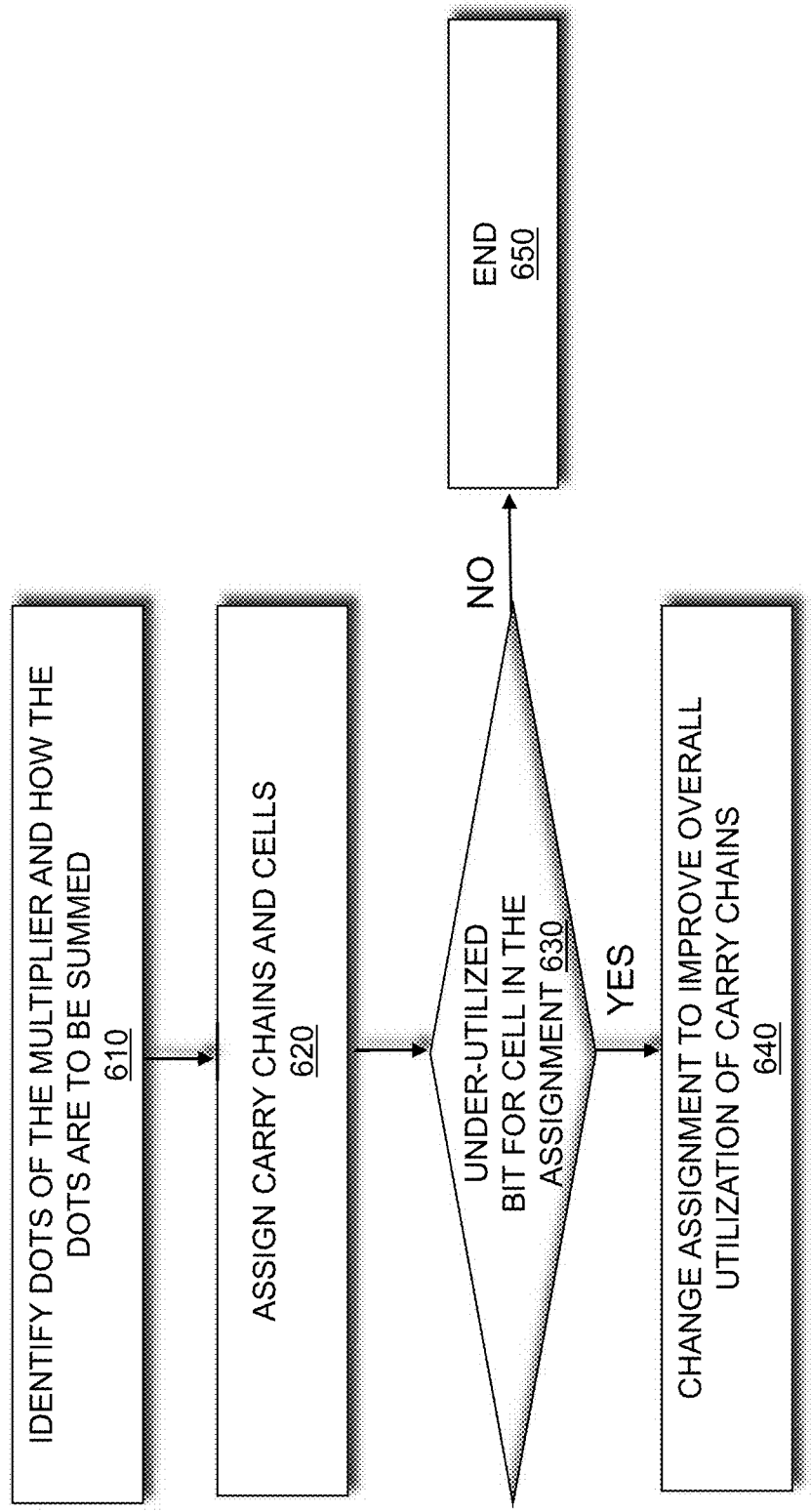

|   | 0 | 1 | 2 | 3 | 4 | 5 | 6 |
|---|---|---|---|---|---|---|---|
|   | a0b0 | a0b1 | a0b2 | a0b3 |      |      |      |
|   |      | a1b0 | a1b1 | a1b2 | a1b3 |      |      |
|   |      |      | a2b0 | a2b1 | a2b2 | a2b3 |      |
|   |      |      |      | a3b0 | a3b1 | a3b2 | a3b3 |

FIG. 7A

|   | 0 | 1 | 2 | 3 | 4 |
|---|---|---|---|---|---|
|   | a0b0 | a0b1 | a0b2 | a1b2 |  |
|   |  | a1b0 | a1b1 | a2b1 | a2b2 |
|   |  |  | a2b0 |  |  |

| | 0 | 1 | 2 | 3 | 4 | 5 | 6 |
|---|---|---|---|---|---|---|---|
| | b0a0 | b0a1 | b0a2 | b0a3 | | | |
| | | b1a0 | b1a1 | b1a2 | b1a3 | | |
| | | | b2a0 | b2a1 | b2a2 | b2a3 | |
| | | | | b3a0 | b3a1 | b3a2 | b3a3 |

FIG. 11A

|   | 0 | 1 | 2 | 3 | 4 | 5 | 6 | 7 |
|---|---|---|---|---|---|---|---|---|
|   | b0a0 | b0a1 | b0a2 | b0a3 | b0a4 |   |   |   |
|   |   | b1a0 | b1a1 | b1a2 | b1a3 | b1a4 |   |   |
|   |   |   | b2a0 | b2a1 | b2a2 | b2a3 | b2a4 |   |
|   |   |   |   | b3a0 | b3a1 | b3a2 | b3a3 | b3a4 |

|   | 0 | 1 | 2 | 3 | 4 |
|---|---|---|---|---|---|
|   | a0b0 | a0b1 | a0b2 |      |      |
|   |      | a1b0 | a1b1 | a1b2 |      |
|   |      |      | a2b0 | a2b1 | a2b2 |

FIG. 13A

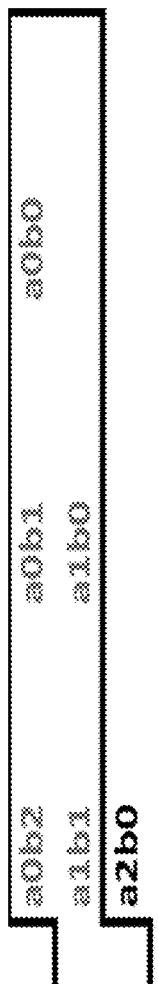
FIG. 13B

| | 0 | 1 | 2 | 3 | 4 |
|---|---|---|---|---|---|
| | a0b0 | a0b1∧a1b0 | a0b2 | a1b2 | |
| | | | a1b1 | a2b1 | |
| | | | a2b0 | | a2b2 |
| | | | a0b1a1b0 | | |

FIG. 13C

|   | 0 | 1 | 2 | 3 | 4 |
|---|---|---|---|---|---|
|   | a0b0 | a0b1^a1b0 | a0b2 | a0b1a1b0 |  |
|   |  | a1b1 & !(a0b0) | a2b0 | a1b2 | a2b2 |
|   |  |  |  | a2b1 |  |

FIG. 13D

| 4 | 3 | 2 | 1 | 0 |
|---|---|---|---|---|
|  | a0b1a1b0 | a0b2 | a0b0 | a0b1^a1b0 |
|  | a1b2 | a1b1 & !(a0b0) |  |  |
| a2b2 | a2b1 | a2b0 |  |  |

Stage 1 b0a0
b0a1 b1a0
b0a2 b1a1 b2a0
b0a3 b1a2 b2a1 b3a0
b1a3 b2a2 b3a1
b2a3 b3a2
b3a3

Stage 2 b0a0
b0a1 b1a0
b0a2 b1a1 b2a0
b0a3 b1a2 w0
b1a3 b2a2 w1
b2a3 b3a2 w2
b3a3

FIG. 15

METHOD AND APPARATUS FOR PERFORMING MULTIPLIER REGULARIZATION

FIELD

Embodiments of the present disclosure relate to integrated circuits. More specifically, embodiments of the present disclosure relate to a method and apparatus for performing multiplier regularization by mapping multipliers onto programmable logic implemented on an integrated circuit.

BACKGROUND

Target devices such as programmable logic devices (PLDs), application specific integrated circuits (ASICs), and structured ASICs are used to implement large systems that may include millions of gates and megabits of embedded memory. The complexity of a large system often requires the use of electronic design automation (EDA) tools to create and optimize a design for the system onto physical target devices. Among the procedures performed by EDA tools in a computer aided design (CAD) compilation flow is hardware description language (HDL) compilation. HDL compilation involves performing synthesis, placement, routing, and timing analysis of the system on the target device.

Machine learning has become increasing valuable in a number of technical fields. For example, machine learning may be used in natural language processing, computer vision, bioinformatics, and economics. Many of the computations involved in machine learning are based on inference using available data, which may be facilitated by the utilization of one or more multipliers. Accordingly, to accommodate the growth and improvement of machine learning applications, the need arises for target devices to efficiently pack a large number of multipliers such that the logic on the target device is efficiently utilized to conserve area, power, and routing resources.

BRIEF DESCRIPTION OF THE DRAWINGS

The features and advantages of embodiments of the present disclosure are illustrated by way of example and are not intended to limit the scope of the embodiments of the present disclosure to the particular embodiments shown.

FIGS. 3A-C illustrate exemplary cells that may be implemented on a target device.

FIG. 6 is flow chart that illustrates a method for redistributing partial products to reduce carry chain length according to an embodiment of the present disclosure.

FIGS. 7A-7C illustrate an example of redistributing partial product bits to reduce carry chain length according to an embodiment of the present disclosure.

FIGS. 9A-9C illustrate an example and cell arrangement for calculating a partial product bit for subsequent columns of an adder to reduce a number of carry chains according to an embodiment of the present disclosure.

FIGS. 11A-11D illustrate an example of adding an earlier column of an adder to generate addends if a partial product bit is in a least significant bit position according to an embodiment of the present disclosure.

FIGS. 12A-12D illustrate an example and cell arrangement of adding earlier columns of an adder to generate addends if partial product bits are in a least significant bit position and a second least significant bit position according to an embodiment of the present disclosure.

FIGS. 13A-13H illustrate an example and cell arrangement of calculating partial product bits for subsequent columns of an adder to reduce a number of carry chains using cells that do not support a shared arithmetic function according to an embodiment of the present disclosure.

FIGS. 14A-C illustrate an example and cell arrangement of mapping a 4×4 multiplier according to an embodiment of the present disclosure.

FIG. 15 illustrate an example of mapping a 6×6 multiplier according to an embodiment of the present disclosure.

DETAILED DESCRIPTION

In the following description, for purposes of explanation, specific nomenclature is set forth to provide a thorough understanding of embodiments of the present disclosure. It will be apparent to one skilled in the art that specific details in the description may not be required to practice the embodiments of the present disclosure. In other instances, well-known circuits, devices, procedures, and programs are shown in block diagram form to avoid obscuring embodiments of the present disclosure unnecessarily.

Embodiments of the present disclosure relate generally to increasing the density of multipliers implemented on an integrated circuit. More specifically, the present disclosure relates to an efficient mapping of multipliers to programmable logic. These multipliers may be implemented as soft multipliers, which are memory-based multipliers. By reducing the logic and routing involved with the implementation of soft multipliers, the present disclosure discloses a mapping of soft multipliers that may require less area on and/or fewer resources of the programmable logic, may use less power, and may run faster in handling computations.

To reduce the logic and routing involved with implementing and/or mapping multipliers to programmable logic, multiplier regularization may be performed on the multipliers. Multiplier regularization may include factoring out a partial product level of a multiplier by utilizing combinatorial circuits to perform processing out of band soft logic associated with a carry chain (adder chain) of the multiplier. It should be appreciated that a carry chain may be implemented by and referred to as a chain of PLD cells. The chain of PLD cells may be connected through CIN and COUT ports. Additionally or alternatively, multiplier regularization may include refactoring arithmetic performed by the multiplier so that ternary arithmetic may be implemented with a binary arithmetic logic structure. Multiplier regularization may also include using N:N compression to introduce gaps in the combination of partial products so that ones and twos complement arithmetic of signed operations may be implemented with a fewer number of levels. It should be appreciated that multiplier regularization may include a combination of the techniques described above.

According to an embodiment of the present disclosure, a method for implementing a multiplier on a programmable logic device (PLD) includes implementing the multiplier as a tree of chains of PLD cells. Partial product bits are redistributed between chains of the PLD cells in such a way that every PLD cell is fully utilized, while the overall number of PLD cells used is reduced.

Figure 1:
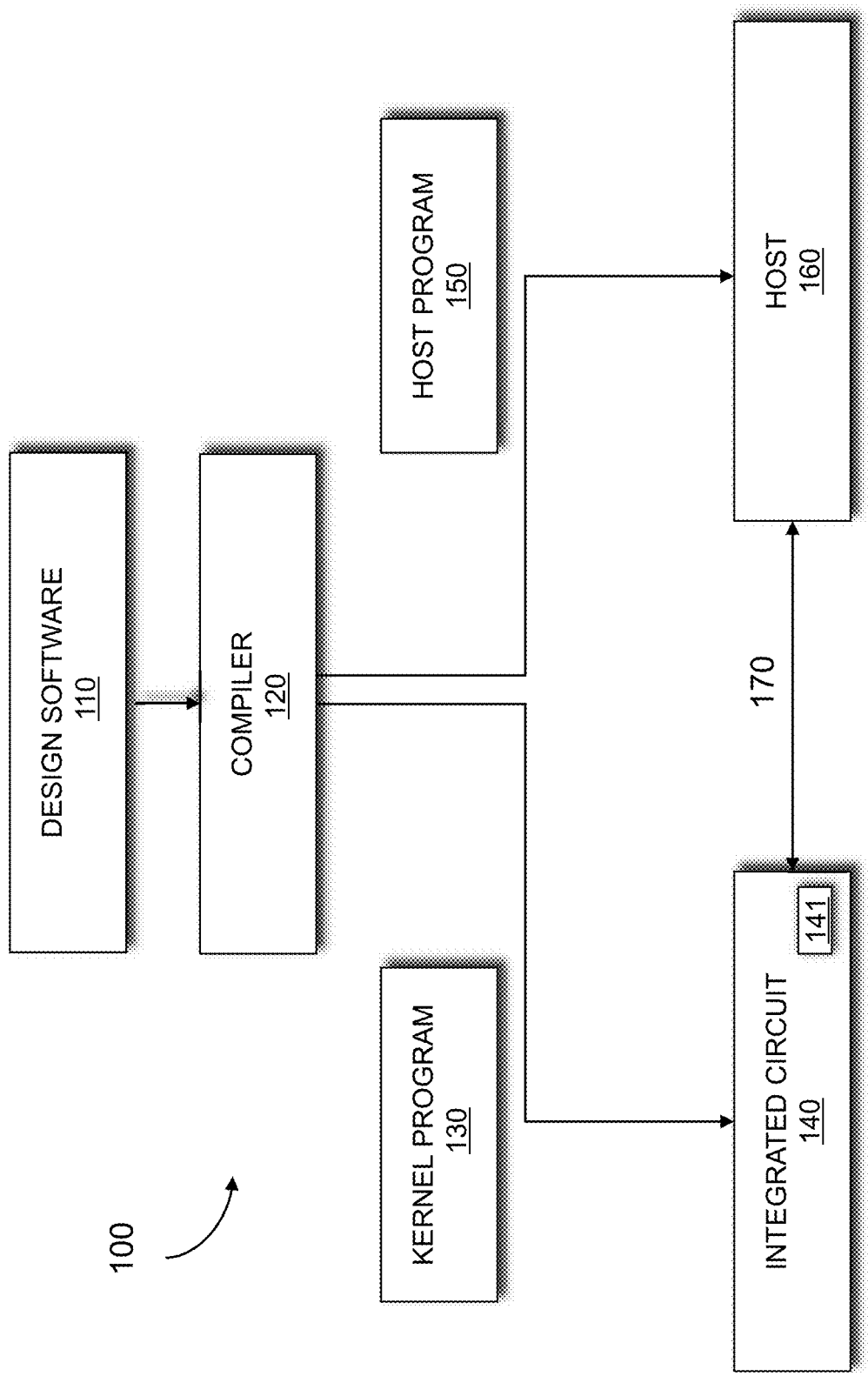
FIG. 1 is a block diagram of a system for implementing machine learning according to an exemplary embodiment of the present disclosure.

FIG. 1 is a block diagram of a system 100 for implementing machine learning according to an exemplary embodiment of the present disclosure. A designer may desire to implement various functionalities on an integrated circuit device 140. The integrated circuit 140 device may be a programmable logic device such as a field programmable gate array (FPGA). The designer may specify a high-level program, such as OpenCL, to be implemented. The high-level program may enable the designer to provide programming instructions to configure a set of programmable logic cells for the integrated circuit device 140 without requiring specific knowledge of low level hardware description languages, such as Verilog or VHDL.

The designers may implement their high-level designs using design software 110, such as a version of Intel® Quartus® by Intel Corporation. The design software 110 may use a compiler 120 to convert the high-level program into lower-level description. It should be appreciated that the design software 110 and compiler 120 may be implemented by an EDA tool and be referred to as a system designer. The compiler 120 may provide machine-readable instructions representative of the high-level program to a host 160 and the integrated circuit device 140. The host 160 may receive a host program 150 which may be implemented by a kernel program 130. To implement the host program 150, the host 160 may communicate instructions from the host program 150 to the integrated circuit device 140 via a communication link 170. According to an embodiment of the present disclosure, the kernel program 130 and the host 160 may enable configuration of a multiplier 141 on the integrated circuit device 140. The multiplier 141 may include circuitry and/or other logic elements and may be configured to implement, for example, machine learning operations.

Figure 2:
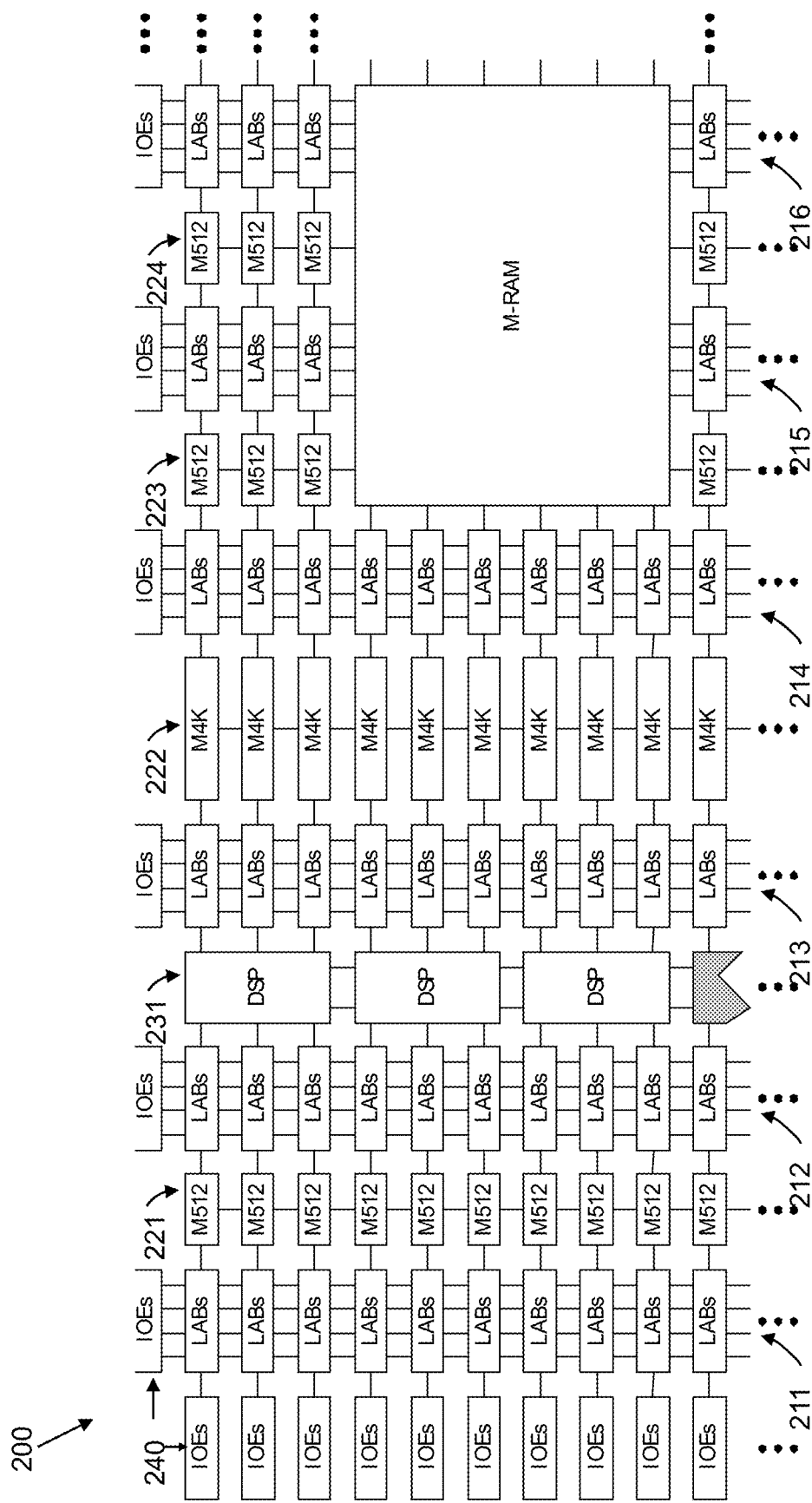
FIG. 2 illustrates an exemplary target device according to an exemplary embodiment of the present disclosure.

FIG. 2 illustrates a target device 200 according to an embodiment of the present disclosure. The target device 200 may be implemented on a die as an integrated circuit. The target device 200 is a programmable logic device such a field programmable gate array (FPGA) that includes a plurality of logic-array blocks (LABs). According to an embodiment of the present disclosure, the target device 200 may be implemented on a single integrated circuit such as integrated circuit device 140 (shown in FIG. 1). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present disclosure, the logic block may operate similarly to a logic element (LE), such as those found in the Stratix or Cyclone devices manufactured by Intel Corporation, or a combinational logic block (CLB) such as those found in Virtex devices manufactured by Xilinx Inc. In this embodiment, the logic block may include a four input LUT with a configurable register. According to an embodiment of the present disclosure, the logic block may be implemented by an adaptive logic module (ALM), such as those found in Stratix devices manufactured by Intel Corporation. LABs are grouped into rows and columns across the device 200. Columns of LABs are shown as 211-216. It should be appreciated that the logic block may include additional or alternate components. It should be appreciated that a carry chain may be implemented with the resources of one or more LABs in the device 200.

The device 200 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 200. Columns of memory blocks are shown as 221-224.

The device 200 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 200 and are shown as 231.

The device 200 includes a plurality of input/output elements (IOEs) 240. Each IOE feeds an IO pin (not shown) on the device 200. The IOEs 240 are located at the end of LAB rows and columns around the periphery of the device 200. Each IOE may include a bidirectional IO buffer and a plurality of registers for registering input, output, and output-enable signals.

The device 200 may include routing resources such as LAB local interconnect lines, row interconnect lines ("H-type wires"), and column interconnect lines ("V-type wires") (not shown) to route signals between components on the target device.

Figure 3A:
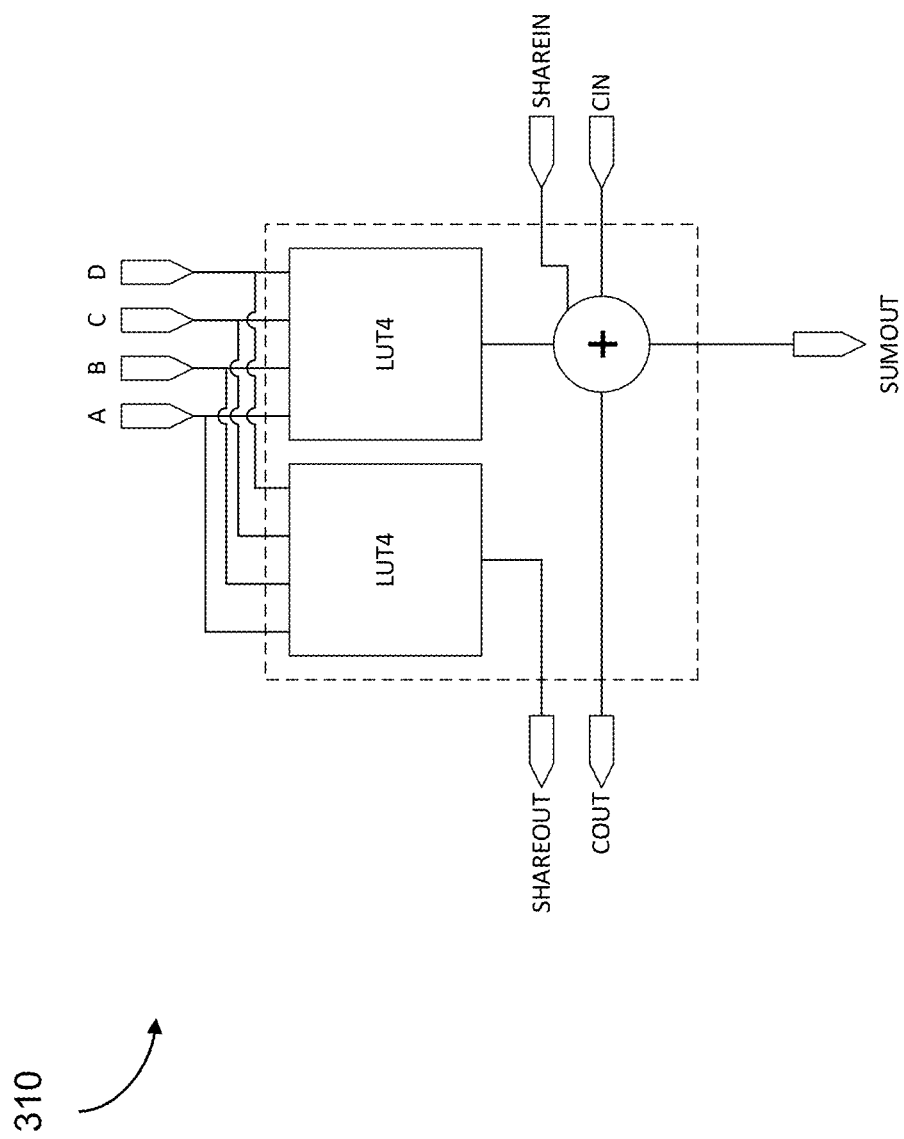
Figure 3B:
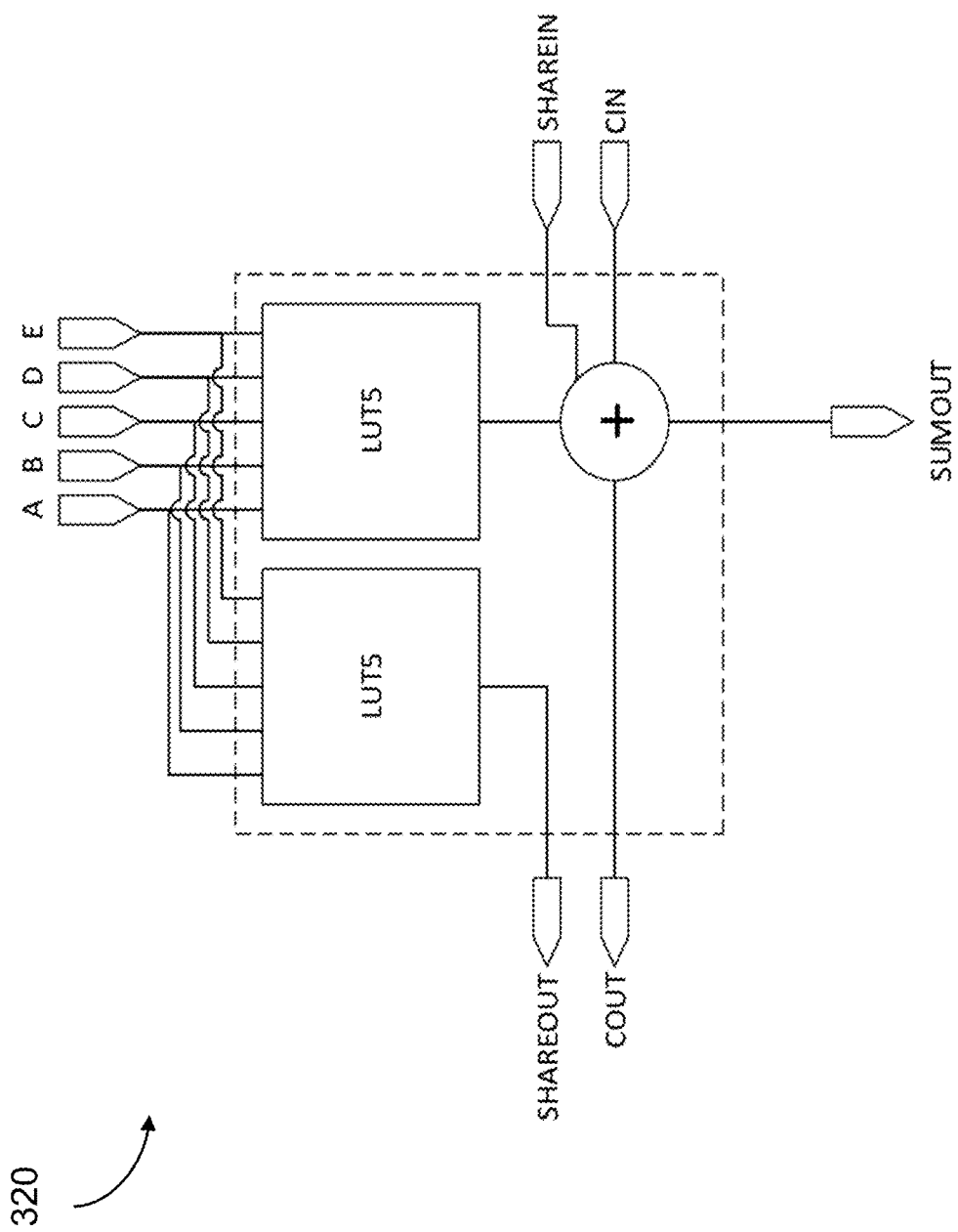

FIGS. 3A-C illustrate exemplary cells that may be implemented on a target device. A LAB on a target device may include one or more logic cells ("cells"), where each logic cell includes one or more outputs, LUTs, and logic. The logic cell support carry-in and carry-out signals and LUTs at its inputs. A LUT on the logic cell may be decomposed to partially perform ripple carry adders used for arithmetic. Alternatively, a dedicated adder or carry support structure may be provided after the LUT on the logic cell. FIG. 3A illustrates a first exemplary logic cell 310 according to an embodiment of the present disclosure. The logic cell 310 supports 4 input signals, A-D, into two 4 input LUTs. The logic cell 310 includes an adder at the output of one of its LUTs. The logic cell 310 also includes an input to the adder, SHAREIN, and an output from one of its LUTs, SHAREOUT, that allows the logic cell 310 to support a shared arithmetic mode.

FIG. 3B illustrates a second exemplary logic cell 320 according to an embodiment of the present disclosure. Logic cell 320 is similar to logic cell 310 with the exception that it supports 5 input signals, A-E, and includes two 5 input LUTs. It should be appreciated that the carry out (COUT)/share out (SHAREOUT) output can only be connected to a carry in (CIN)/share in (SHAREIN) input of a next logic cell. The carry in (CIN)/share in (SHAREIN) input of a logic cell is either grounded or connected to a carry out (COUT)/ shareout (SHAREOUT) of a previous logic cell. The carry in and carry out connections are configured to be faster than the connections through sum output (SUMOUT). The logic cell 320 also includes an input to the adder, SHAREIN, and an output from one of its LUTs, SHAREOUT, that allows the logic cell 320 to support a shared arithmetic mode.

FIG. 3C illustrates a third exemplary logic cell 330 according to an embodiment of the present disclosure. The logic cell 330 supports 4 input signals, A-D, into two 4 input LUTs. The logic cell 330 includes logic and a multiplexer at the output of the LUTs to support adder functionality. The logic cell 330 does not support a shared arithmetic mode. According to an embodiment of the present disclosure, the logic cells described with reference to FIGS. 3A-3C may be used to implement the combinational cells described with reference to FIG. 2.

Figure 4:
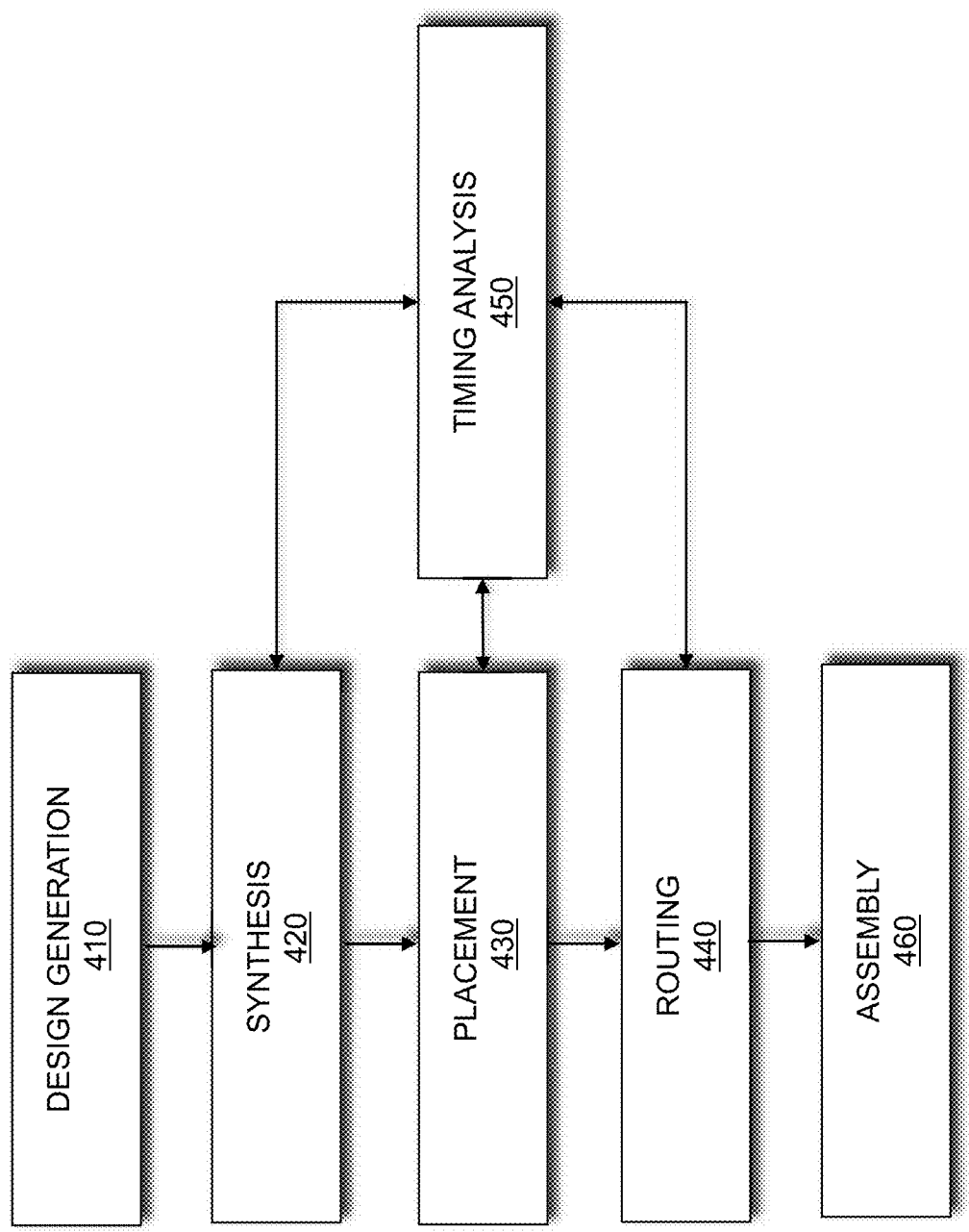
FIG. 4 is a flow chart illustrating a method for designing a system on a target device according to an exemplary embodiment of the present disclosure.

FIG. 4 is a flow chart illustrating a method for designing a system on a target device according to an exemplary embodiment of the present disclosure. The procedures described in FIG. 4 may collectively be referred to as "compilation" of a design. The target device may be a programmable logic device such as a field programmable gate array (FPGA), application specific integrated circuit (ASIC), a structured ASIC, or other device whose functionality may be described by a hardware description language (HDL). The procedures described with reference to FIG. 4 may be performed by an electronic design automation tool executing design software 110 (shown in FIG. 1). At 410, a design for the system is generated. According to an embodiment of the present disclosure, the design is generated in response to input provided by a user. In this embodiment, the user may input a register-transfer-level (RTL) description of the system, select and connect logic from a design library, or utilize other design input options. Alternatively, the input provided by the user may be a computer language description of the system. In this embodiment, a high-level compilation of the computer language description of the system is performed. The design for the system generated may be in HDL.

At 420, the system is synthesized and a netlist is generated. Synthesis includes generating a logic design of the system to be implemented by the target device. According to an embodiment of the present disclosure, synthesis generates an optimized logical representation of the system from an HDL design definition. Synthesis also includes mapping the optimized logic design (technology mapping). Mapping includes determining how to implement logic gates and logic elements in the optimized logic representation with specific resources on the target device such as logic elements and functional blocks. According to an embodiment of the present disclosure, mapping also includes determining how to implement multipliers in the system with specific resources on the target device. In this embodiment, one or more multiplier regularization procedures are performed during synthesis. Multiplier density is improved by performing factorizations of multipliers, and leveraging new uses of available LUT modes. According to an embodiment of the present disclosure, a netlist is generated from mapping. This netlist may be an optimized technology-mapped netlist generated from the HDL.

At 430, the system is placed. According to an embodiment of the present disclosure, placement involves placing the mapped logical system design on the target device. Placement works on the technology-mapped netlist to produce a placement for each of the logic elements and functional blocks. According to an embodiment of the present disclosure, placement includes fitting the system on the target device by determining which resources on the target device are to be used to implement the logic elements and functional blocks identified during synthesis. Placement may include clustering which involves grouping logic elements together to form the logic clusters present on the target device. According to an embodiment of the present disclosure, clustering is performed at an early stage of placement and occurs after synthesis during the placement preparation stage. Placement may also minimize the distance between interconnected resources to meet timing constraints of the timing netlist.

At 440, the placed design is routed. During routing, routing resources on the target device are allocated to provide interconnections between logic gates, logic elements, and other components on the target device. According to an embodiment of the present disclosure, routing aims to reduce the amount of wiring used to connect components in the placed logic design. Routability may include performing fanout splitting, logic duplication, logical rewiring, or other procedures. It should be appreciated that one or more of the procedures may be performed on the placed logic design. Timing optimization may also be performed during routing to allocate routing resources to meet the timing constraints of the timing netlist.

At 450, timing analysis is performed on the system designed. According to an embodiment of the present disclosure, the timing analysis determines whether timing constraints of the system are satisfied. As part of timing analysis, slack analysis may be performed. It should be appreciated that the timing analysis may be performed during and/or after each of the synthesis 420, placement 430, and routing procedures 440 to guide compiler optimizations.

At 460, an assembly procedure is performed. The assembly procedure involves creating a program file that includes information determined by the procedures described at 410, 420, 430, 440, and 450. The program file (configuration file) may be a configuration bit stream that may be used to program (configure) a target device. In the case of an ASIC, the program file may represent the physical layout of the circuit. According to an embodiment of the present disclosure, the procedures illustrated in FIG. 4 may be performed by an EDA tool executed on a first computer system. The program file generated may be transmitted to a second computer system to allow the design of the system to be further processed. The program file may be transmitted from either the first or second computer system onto the target device and used to program the target device according to the system design. It should be appreciated that the design of the system may also be output in other forms such as on a display device or other medium. The target device may be programmed with the program file. By programming the target with the program file, components (programmable resources) on the target device are physically transformed to implement the system.

According to an embodiment of the present disclosure, when the target device is a programmable logic device, the programmable resources may include components such as programmable logic blocks, and digital signal processor blocks that may be used to implement logic functions. The programmable resources may also include programmable routing that connects the logic functions. The program file with configuration bitstream may be used to configure an FPGA using various programming technologies. For instance, the FPGA may utilize static random access memory (SRAM), flash, or antifuse-based programming technology to program the programmable resources. The SRAM-based programming technology uses static memory cells which are divided throughout the FPGA to configure routing interconnect which are steered by small multiplexers, and to configure logic blocks to implement logic functions. Similarly, flash-based programming technology uses floating-gate transistors in flash memory for configuration storage. Antifuse-based programming technology requires burning of antifuses to program resources. The antifuse-based programming technology allows for programming only once and FPGAs utilizing antifuse-based programming cannot be reprogrammed.

Figure 5:
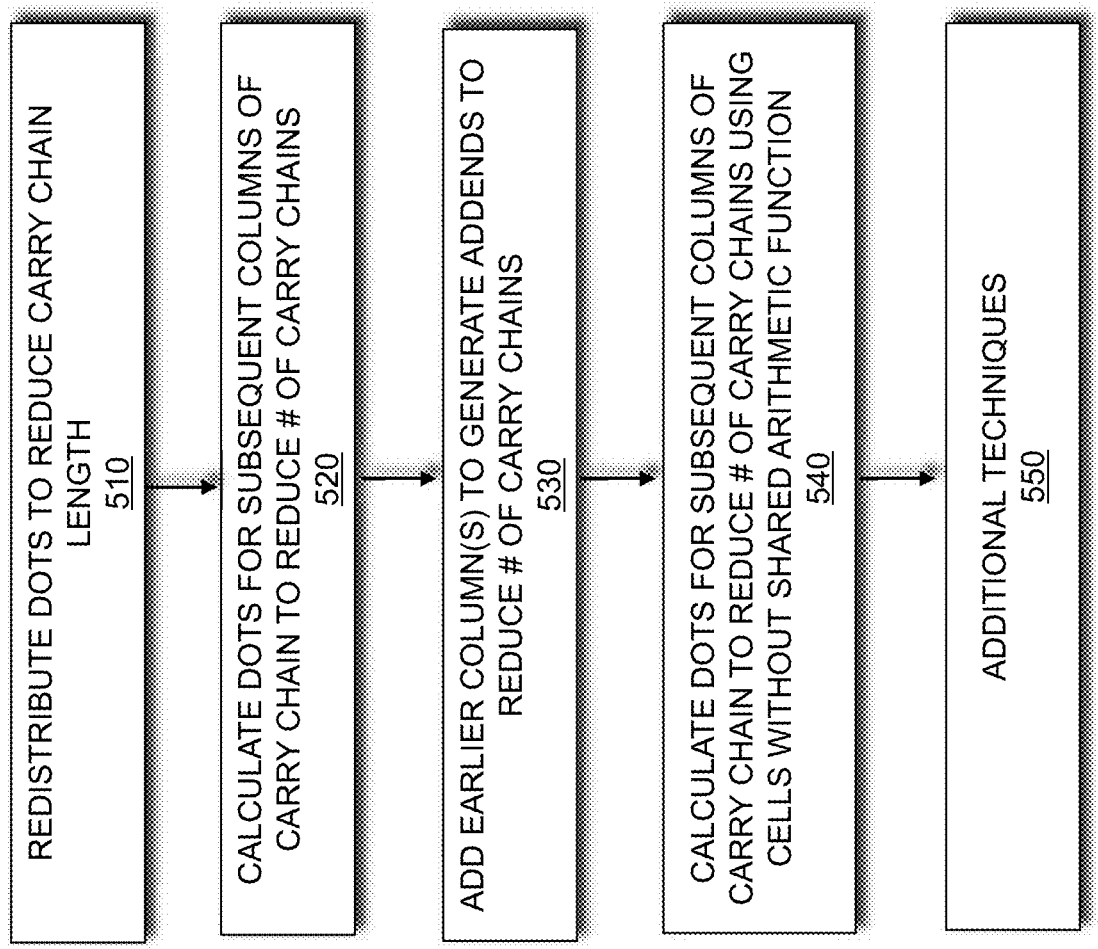
FIG. 5 illustrates multiplier regularization procedures that may be performed during synthesis according to an embodiment of the present disclosure.

FIG. 5 illustrates multiplier regularization procedures that may be performed during synthesis according to an embodiment of the present disclosure. The procedures described with reference to FIG. 5 may be performed during synthesis 420 (shown in FIG. 4). At 510 individual partial product bits ("dots") are redistributed between carry chains in a multiplier. The carry chains may be implemented by and referred to as a chain of PLD cells. The redistribution may allow for a reduction in length of a first-level and second-level carry chain.

At 520, partial product bits for subsequent columns of an adder are computed using a shared arithmetic mode of a cell. This procedure may reduce a number of carry chains required for implementing the multiplier.

At 530, one or more columns are added to the adder at the least significant bit side of a carry chain. This procedure may reduce a number of carry chains required for implementing the multiplier when there are partial product bits having a greater number of inputs than what is supported by a cell.

At 540, partial product bits for subsequent columns of an adder are computed without requiring use of a shared arithmetic mode of a cell. This procedure may reduce a number of carry chains required for implementing the multiplier.

At 550, one or more additional techniques are applied to implement various types of multipliers using cells with a shared arithmetic mode. It should be appreciated that 4×4, 6×6, and other types of multipliers may be implemented.

FIG. 6 is flow chart that illustrates a method for redistributing partial product bits to reduce carry chain length according to an embodiment of the present disclosure. The procedures described with reference to FIG. 6 may be used to implement procedure 510 described in FIG. 5. The carry chain may be implemented by and referred to as a chain of PLD cells.

At 610, given a multiplier, identify individual partial product bits ("dots") to be computed and identify a manner in which the partial product bits are to be summed to generate a final product of a multiplier and a multiplicand. According to an embodiment of the present disclosure, this may be achieved by generating a multiplication table. The multiplication table, a representation that may be referred to as the "pencil and paper" method, illustrates the final product as an array of partial product bits.

At 620, carry chains and cells in the carry chains on a target device are assigned for generating and summing the partial product bits. According to an embodiment of the present disclosure, columns in the multiplication table may be used to identify partial product bits to be summed by a cell of a carry chain. More than one carry chain may be assigned if the multiplier requires a larger number of partial product bits to be summed than is supported by the functionality of available cells on the target device.

At 630, it is determined whether any of the assigned cells in the assigned carry chains has an under-utilized bit. According to an embodiment of the present disclosure, an under-utilized bit is identified when a cell is not summing two bits (values). It should be appreciated that in addition to or alternatively to determining whether any of the assigned cells in the assigned carry chains has an under-utilized bit, whether a PLD cell is under-utilized may be determined. A PLD cell may be under-utilized if it sums up only one partial product array bit. A PLD cell may also be under-utilized if not all of its inputs are used. If an under-utilized bit or PLD cell is detected, control proceeds to 640. If an under-utilized bit or PLD cell is not detected, control proceeds to 650.

Figure 7B:
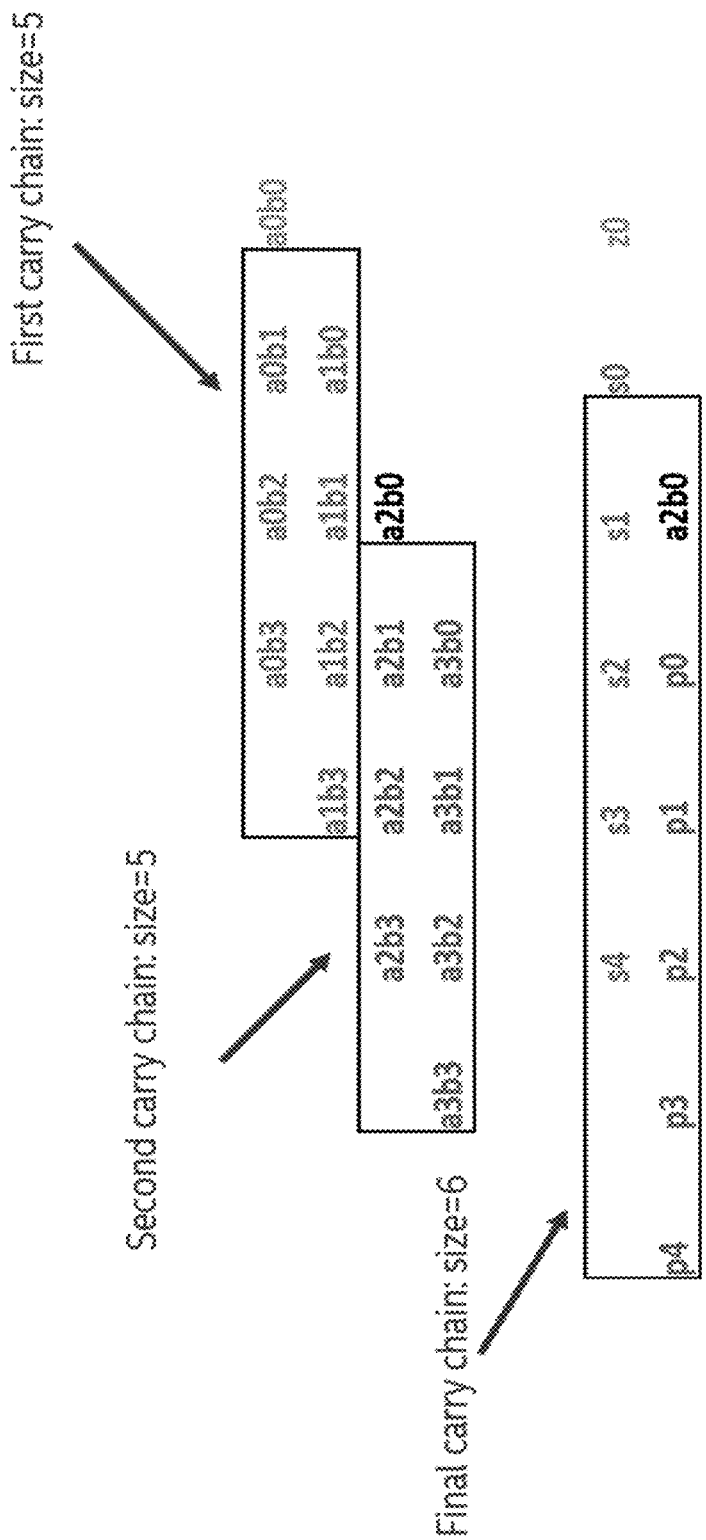
Figure 7C:
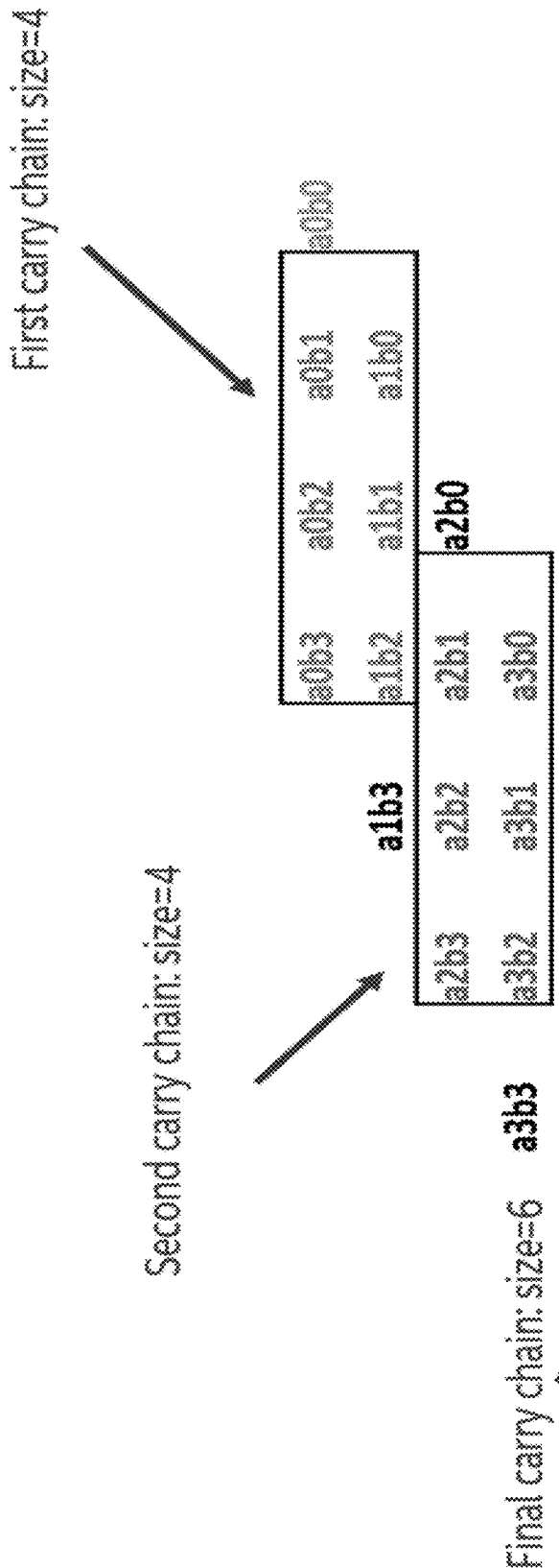

At 640, the assignment of carry chains and cells for generating and summing the partial product bits to another cell is changed to improve the overall utilization of the carry chains and cells in the carry chain. According to an embodiment of the present disclosure, changing the assignment of the carry chains and the cells includes moving a partial product bit to be summed from a carry chain to another carry chain that is lower in order. According to an embodiment of the present disclosure, the order of a carry chain is lower than another carry chain when its position in a multiplier mapping is beneath the another carry chain. For example, the second carry chain in FIGS. 7B and 7C is lower in order than the first carry chain. Also the final carry chain in FIGS. 7B and 7C is lower in order than the first and second carry chains. Improving the overall utilization of the carry chains may result in shortening a length of at least one of the carry chains by reducing a number of cells required while not increasing a length of the carry chains assigned. According to an embodiment of the present disclosure, changing the assignment of the carry chains and the cells includes utilizing a half adder. In one embodiment, for a sum of two bits, the half adder performs an exclusive OR operation to generate a least significant bit of the sum of the two bits, and performs an AND operation to generate a most significant bit of the sum of the two bits.

At 650, control terminates the procedure.

FIGS. 7A-7C illustrate an example of redistributing partial product bits to reduce carry chain length according to an embodiment of the present disclosure. The carry chain may be implemented by and referred to as a chain of PLD cells. In this example, an unsigned 4×4 multiplier calculates a product of two 4-bit unsigned numbers, {a3, a2, a1, a0} * {b3, b2, b1, b0}. With reference to 610 (shown in FIG. 6), partial product bits to be computed and a manner in which the partial product bits are to be summed to generate a final product are identified by generating a multiplication table. FIG. 7A illustrates a multiplication table that includes an array of partial product bits ("partial product array"). Each column of the multiplication table includes one or more partial product bits to be summed to generate a final product that represents the product of the 4×4 multiplier. As shown there are 7 columns, columns 0-6, where column 0 at the right end of the multiplication table represents the least significant bit, and column 6 at the left end of the multiplication table represents the most significant bit.

With reference to 620 (shown in FIG. 6), carry chains and cells in the carry chains on a target device are assigned for generating and summing the partial product bits. FIG. 7B illustrates a mapping of the 4×4 multiplier according to an exemplary embodiment of the present disclosure. As shown, a first carry chain of size 5 is used to sum up to 2 partial product bits from each of columns 1-4 of the multiplication table shown in FIG. 7A. A second carry chain of size 5 is used to sum up to 3 partial product bits from columns 3-5 of the multiplication table shown in FIG. 7A. A final carry chain of size 6 is used to sum the results of the first carry chain and the second carry chain. Terms s0-s4 represent the results generated from the first carry chain, and terms p0-04 represent the results generated from the second carry chain. It should be appreciated that the computation performed at each column of a carry chain, generating the partial product bits and summing the partial product bits, is intended to be performed by a cell on the target device. As such, the first carry chain of size 5 and the second carry chain of size 5 are each implemented by 5 cells, and the final carry chain of size 6 is implemented by 6 cells.

With reference to 630 (shown in FIG. 6), it is determined whether any of the assigned cells in the assigned carry chains has an under-utilized bit. FIG. 7B illustrates that the last column in the first carry chain only includes partial product bit a1$b$3. Similarly, the last column in the second carry chain only includes partial product bit a3$b$3. Since the cells processing these columns are not summing two bits (values), the cells are under-utilized.

With reference to 640 (shown in FIG. 6), the assignment of carry chains and cells for generating and summing the partial product bits to another cell is changed to improve the overall utilization of the carry chains and cells in the carry chain. It is recognized that partial product bits a1$b$3 and a3$b$3 could be implemented in the final-carry chain. Such a rearrangement allows for the reduction of length of the first carry chain and the second carry chain. FIG. 7C illustrates a change of assignment of the carry chains and cells for generating and summing the partial product bits. As shown in FIG. 7C, the first carry chain has been shortened to a length of 4, and the second carry chain has been shortened to a length of 4. The values r0-r3 represent the results generated from the first carry chain, and the values q0-q3 represent the results generated from the second carry chain. A half adder is implemented at the final carry chain to handle a1$b$3 and a3$b$3. When computing the sum of two bits, the half adder performs an exclusive OR operation to generate a least significant bit of the sum of the two bits, and performs an AND operation to generate a most significant bit of the sum of the two bits.

Figure 8:
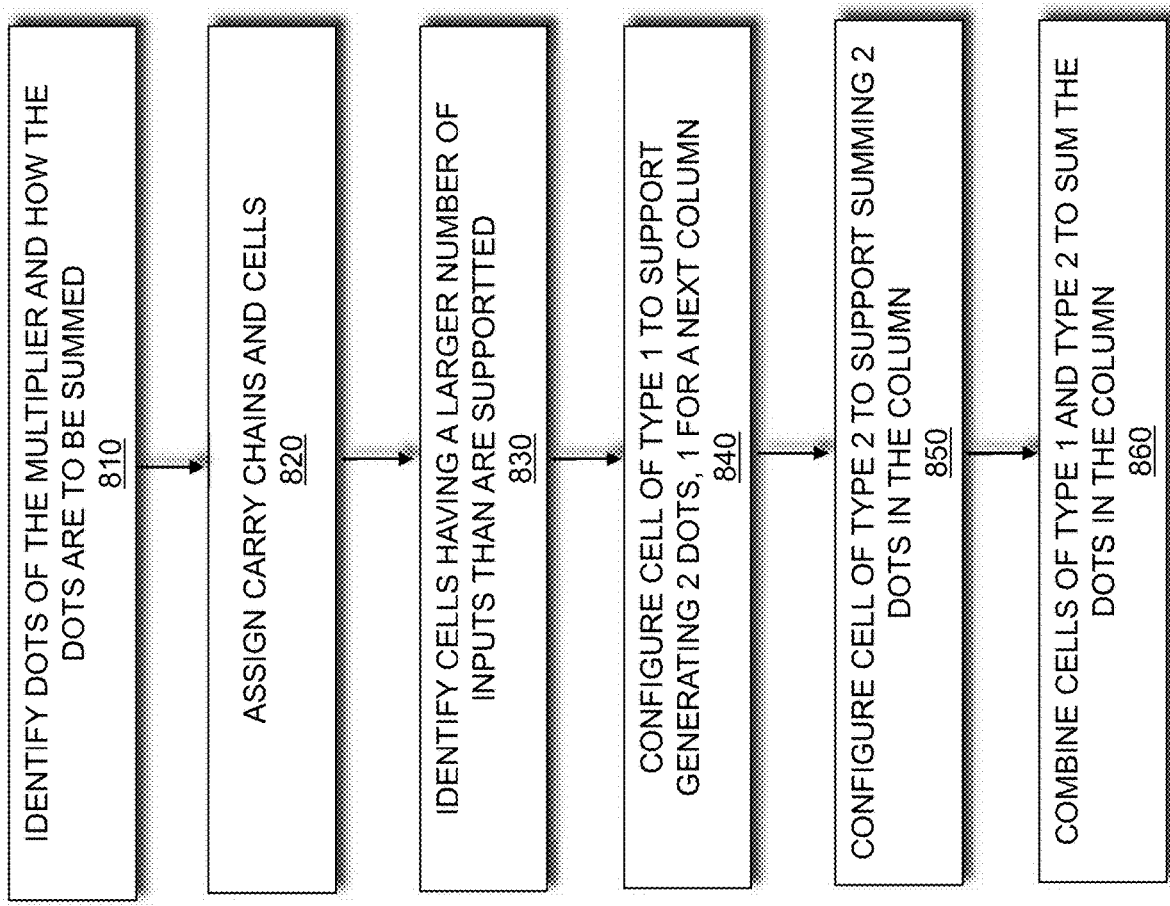
FIG. 8 is a flow chart that illustrates a method for calculating a partial product bit for subsequent columns of an adder to reduce a number of carry chains according to an embodiment of the present disclosure.

FIG. 8 is a flow chart that illustrates a method for calculating a partial product bit for subsequent columns of an adder to reduce a number of carry chains according to an embodiment of the present disclosure. The carry chains may be implemented by and referred to as a chain of PLD cells. The procedures described with reference to FIG. 6 may be used to implement procedure 520 described in FIG. 5.

At 810, given a multiplier, identify individual partial product bits ("dots") to be computed and identify a manner in which the partial product bits are to be summed to generate a final product of a multiplier and a multiplicand. According to an embodiment of the present disclosure, this may be achieved by generating a multiplication table. The multiplication table, a representation that may be referred to as the "pencil and paper" method, illustrates the final product as an array of partial product bits.

At 820, carry chains and cells in the carry chains on a target device are assigned for generating and summing the partial product bits. According to an embodiment of the present disclosure, columns in the multiplication table may be used to identify partial product bits to be summed by a cell of a carry chain. More than one carry chain may be assigned if the multiplier requires a larger number of partial product bits to be summed than is supported by the functionality of available cells on the target device. It should be appreciated that an aggressive approach may be taken for an initial assignment of a carry chain and cell where a larger number of partial product bits which results in a larger number of inputs are required to be processed by a cell than is supported by a cell.

At 830, cells having a larger number of inputs than are supported are identified. According to an embodiment of the present disclosure, an assumption may be made that the generating and summing of partial product bits in each column of a carry chain is performed by an assigned cell. As such, the capabilities of the cell may limit the number of inputs it supports.

At 840, a first type of cell (type 1) is configured that calculates a first partial product bit for a column of a carry chain and a second partial product bit for a subsequent column of the carry chain. According to an embodiment of the present disclosure the first type of cell supports a shared arithmetic mode that allows it to transmit a value computed by a LUT to an input of another cell. Configuring the first type of cell may include setting a first look up table to generate a first partial product bit for the column, and setting a second LUT to generate a second partial product bit for the subsequent column.

At 850, a second type of cell (type 2) is configured that computes a sum of at least two partial product bits for a column of a carry chain. According to an embodiment of the present disclosure, the second type of cell may compute a sum of a value generated from one or more partial product bits for a column of a carry chain and the second partial product bit generated from a first type of cell. According to an embodiment of the present disclosure, configuring the second cell includes transmitting the second partial product bit received from the first cell to an adder on the second cell, and transmitting the value to the adder on the second cell. It should be appreciated that the value may represent a value of a partial product bit or a least significant bit of a sum of two partial product bits. The least significant bit of the sum of two partial product bits may be computed by XORing the value of the two partial product bits.

At 860, the first type of cell and the second type of cell are utilized to sum the partial product bits of cells having a larger number of inputs than are supported.

Figure 9B:
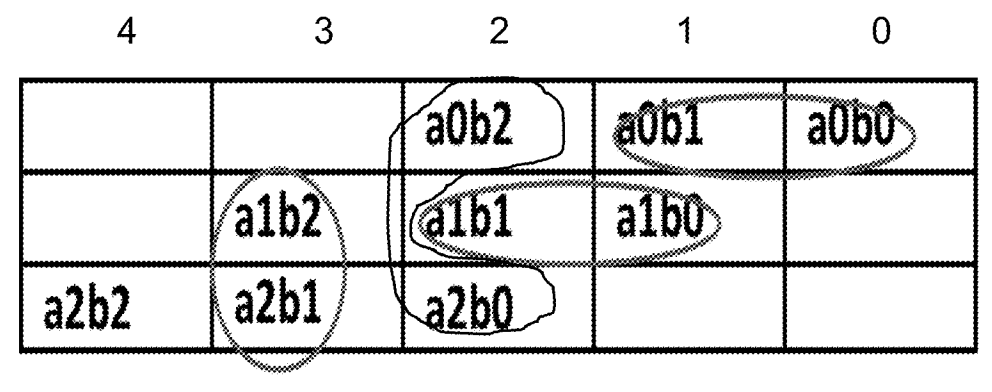
Figure 9C:
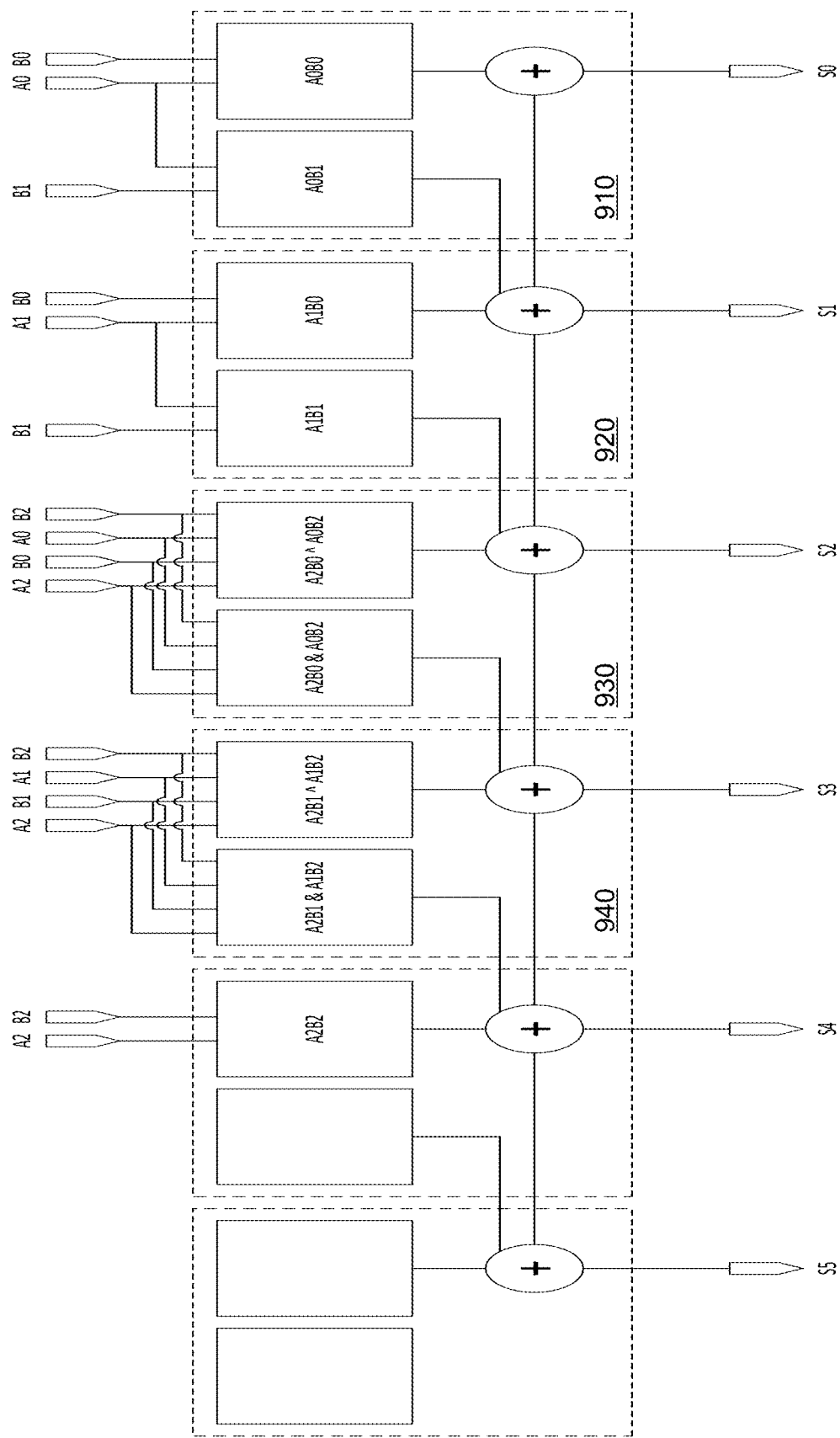

FIGS. 9A-9C illustrate an example and cell arrangement for calculating a partial product bit for subsequent columns of an adder to reduce a number of carry chains according to an embodiment of the present disclosure. The carry chains may be implemented by and referred to as a chain of PLD cells. In this example, an unsigned 3×3 multiplier calculates a product of two 3-bit unsigned numbers, {a2, a1, a0} * {b2, b1, b0}. With reference to 810 (shown in FIG. 8), partial product bits to be computed and a manner in which the partial product bits are to be summed to generate a final product are identified by generating a multiplication table. FIG. 9A illustrates a multiplication table that includes an array of partial product bits ("partial product array"). Each column of the multiplication table includes one or more partial product bits to be summed to generate a final product that represents the product of the 3×3 multiplier. As shown there are 5 columns, columns 0-4, where column 0 at the right end of the multiplication table represents the least significant bit, and column 4 at the left end of the multiplication table represents the most significant bit.

With reference to 820 (shown in FIG. 8), carry chains and cells in the carry chains on a target device are assigned for generating and summing the partial product bits. In an embodiment where a single carry chain is used to implement the multiplier, FIG. 9A may also illustrate a mapping of the 3×3 multiplier according to an exemplary embodiment of the present disclosure. A single carry chain of size 6 may be assigned to sum up the partial product bits from each of columns 0-4 of the multiplication table shown in FIG. 9A. It should be appreciated that the computation performed at each column of a carry chain, generating the partial product bits and summing the partial product bits, may be intended or assumed to be performed by a cell on the target device. As such, the single carry chain of size 6 is implemented by 6 cells. In this example, each of the cells in the carry chain supports 4 inputs and a shared arithmetic mode.

With reference to 830 (shown in FIG. 8), cells having a larger number of inputs than are supported are identified. In this example, the cell corresponding to column 2 of the multiplication table/carry chain shown in FIG. 9A, is identified as one having a larger number of inputs than supported. As shown in column 2, partial product bits $a0b2$, $a1b1$, and $a2b0$ are generated and summed. These partial product bits require 6 inputs where the corresponding cell supports 4 inputs.

With reference to 840 (shown in FIG. 8), a first type of cell (type 1) is configured that calculates a first partial product bit for a column of a carry chain and a second partial product bit for a subsequent column of the carry chain. According to an embodiment of the present disclosure, the first type of cell supports a shared arithmetic mode that allows it to transmit a value computed by a LUT to an input of another cell.

With reference to 850, a second type of cell (type 2) is configured that computes a sum of at least two partial product bits for a column.

With reference to 860, the first type of cell and the second type of cell are utilized to sum the partial product bits of cells having a larger number of inputs than are supported. FIG. 9C illustrates a cell implementation of the methodology disclosed where a single carry chain is used to implement a 3×3 multiplier. As shown in FIG. 9C, a first cell of type 1 910 is used to generate partial product bit $a0b0$ for column 0 and partial product bit $a0b1$ for a subsequent column, column 1 (shown in FIG. 9B). With reference to FIG. 9C, a second cell of type 1 920 is used to generate partial product bit $a1b0$ for column 1 and partial product bit $a1b1$ from a subsequent column, column 2 (shown in FIG. 9B). With reference to FIG. 9C, a first cell of type 2 930 is used to sum $a0b2$, $a2b0$, and $a1b1$ for column 2 (shown in FIG. 9B). With reference to FIG. 9C, second cell of type 2 940 is used to sum $a1b2$ and $a2b1$ for column 3 (shown in FIG. 9B). By combining the cell of type 1 in column 2 with the cell of type 2 in column 3, the circuit implements three partial product bits for column 3 without requiring a second and third carry chain.

Figure 10:
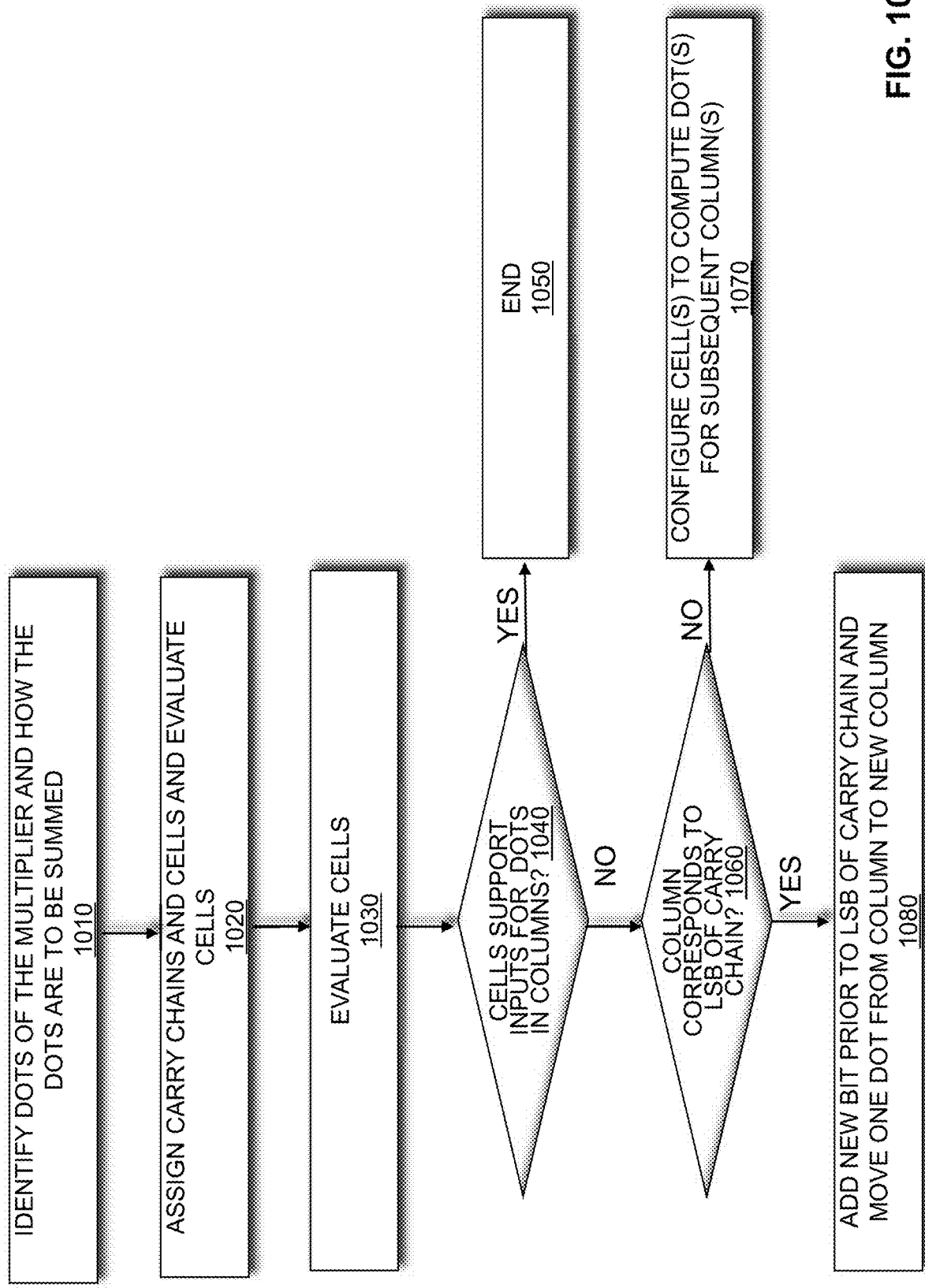
FIG. 10 is a flow chart that illustrates a method for adding earlier columns of an adder to generate addends if a partial product bit is in a least significant bit position according to an embodiment of the present disclosure.

FIG. 10 is a flow chart that illustrates a method for adding columns to a carry chain to generate addends to reduce a number of carry chains in a multiplier according to an embodiment of the present disclosure. The carry chains may be implemented by and referred to as a chain of PLD cells. The procedures described with reference to FIG. 10 may be used to implement procedure 530 described in FIG. 5.

At 1010, given a multiplier, identify individual partial product bits ("dots") to be computed and identify a manner in which the partial product bits are to be summed to generate a final product of a multiplier and a multiplicand. According to an embodiment of the present disclosure, this may be achieved by generating a multiplication table. The multiplication table, a representation that may be referred to as the "pencil and paper" method, illustrates the final product as an array of partial product bits.

At 1020, carry chains and cells in the carry chains on a target device are assigned for generating and summing the partial product bits. According to an embodiment of the present disclosure, columns in the multiplication table may be used to identify partial product bits to be summed by a cell of a carry chain. More than one carry chain may be assigned if the multiplier requires a larger number of partial product bits to be summed than is supported by the functionality of available cells on the target device. It should be appreciated that an aggressive approach may be taken for an initial assignment of a carry chain and cell where a larger number of partial product bits which results in a larger number of inputs are required to be processed by a cell than is supported by a cell. According to an embodiment of the present disclosure, an assumption may be made that the generating and summing of partial product bits in each column of a carry chain is performed by an assigned cell. As such, the capabilities of the cell may limit the number of inputs it supports.

At 1030, the assigned cells are evaluated to determine whether they have a larger number of inputs assigned to them than is supported.

At 1040, if it is determined that the cells support the inputs for generating and summing partial product bits in their respective columns, control proceeds to 1050. If it is determined that the cells do not support the inputs for generating and summing partial product bits in their respective columns, control proceeds to 1060.

At 1050, control terminates the procedure.

At 1060, for each cell that does not support its assigned inputs, if it is determined that the column corresponding to the cell corresponds to a least significant bit of a carry chain, control proceeds to 1080. If it is determined that the column corresponding to the cell does not correspond to a least significant bit of a carry chain, control proceeds to 1070.

At 1070, one or more cells are configured to generate one or more partial product bits for subsequent columns. According to an embodiment of the present disclosure, the method described with reference to FIG. 8 may be implemented.

At 1080, a new bit is added prior to the least significant bit of the carry chain. One partial product bit is moved from the column to the new column corresponding to the new bit.

Figure 11B:
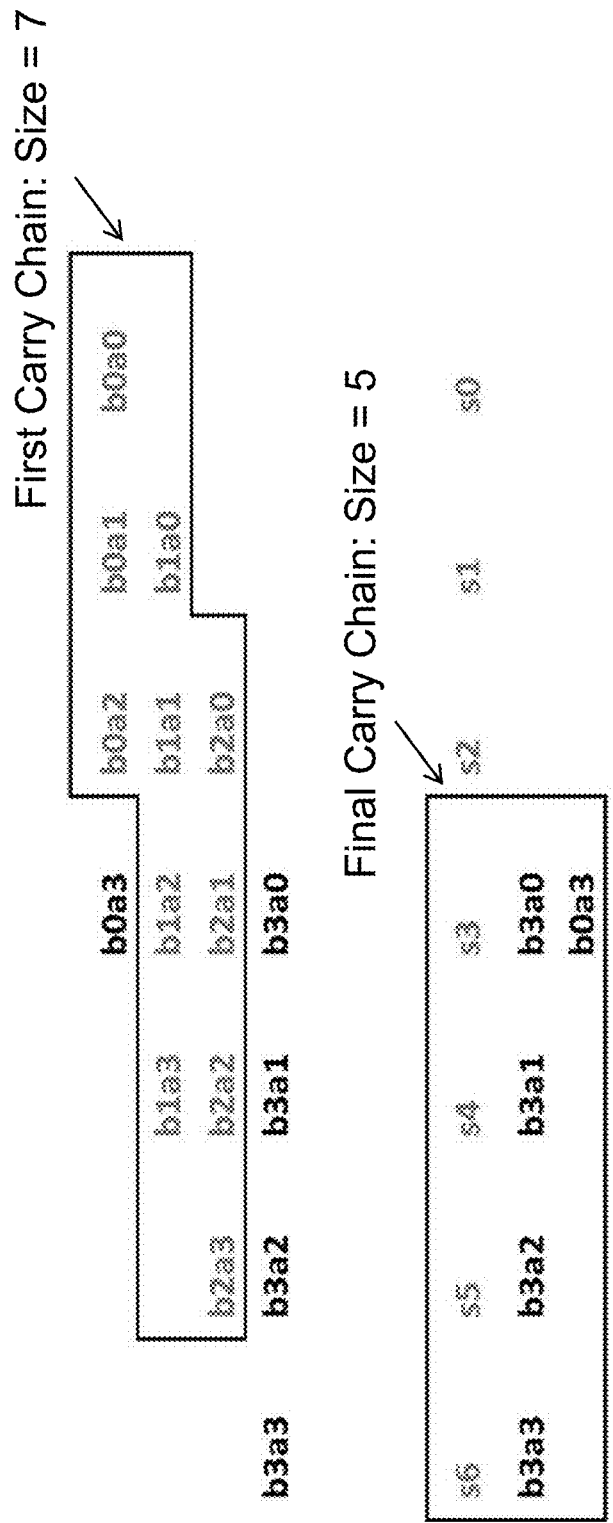

FIGS. 11A-11D illustrate an example of adding a column to a carry chain to generate addends to reduce a number of carry chains in a multiplier according to an embodiment of the present disclosure. The carry chains may be implemented by and referred to as a chain of PLD cells. In this example, an unsigned 4×4 multiplier calculates a product of two 4-bit unsigned numbers, {a3, a2, a1, a0} * {b3, b2, b1, b0}. With reference to 1010 (shown in FIG. 10), partial product bits to be computed and a manner in which the partial product bits are to be summed to generate a final product are identified by generating a multiplication table. FIG. 11A illustrates a multiplication table that includes an array of partial product bits ("partial product array"). Each column of the multiplication table includes one or more partial product bits to be summed to generate a final product that represents the product of the 4×4 multiplier. As shown there are 7 columns, columns 0-6, where column 0 at the right end of the multiplication table represents the least significant bit, and column 6 at the left end of the multiplication table represents the most significant bit.

With reference to 1020 (shown in FIG. 10), carry chains and cells in the carry chains on a target device are assigned for generating and summing the partial product bits. FIG. 11B illustrates a mapping of the 4×4 multiplier according to an exemplary embodiment of the present disclosure. As shown, a first carry chain of size 7 is used to sum up to 3 partial product bits from each of columns 0-6 of the multiplication table shown in FIG. 11A. A final carry chain of size 5 is used to sum the results of the first carry chain and remaining partial product bits. Terms s0-s6 represent the results generated from the first carry chain. It should be appreciated that the computation performed at each column of a carry chain, generating the partial product bits and summing the partial product bits, is intended to be performed by a cell on the target device. As such, the first carry chain of size 7 is implemented by 7 cells, and the final carry chain of size 5 is implemented by 5 cells.

With reference to 1030 (shown in FIG. 10), the assigned cells are evaluated to determine whether they have a larger number of inputs assigned to them than is supported. In this example, each of the cells in the carry chain supports 4 inputs and a shared arithmetic mode.

With reference to 1040, 1060, and 1070, it is determined that column 2 of the first carry chain requires 6 inputs to sum partial product bits b0$a$2, b1$a$1, and b2$a$0. Since the cell assigned for processing the partial product bits in column 2 of the first carry chain does not support the assigned inputs, and column 2 does not correspond to the least significant bit of the carry chain, the technique described with reference to FIG. 8 where a first type of cell and the second type of cell are utilized to sum the partial product bits of cells having a larger number of inputs than are supported.

Figure 11C:
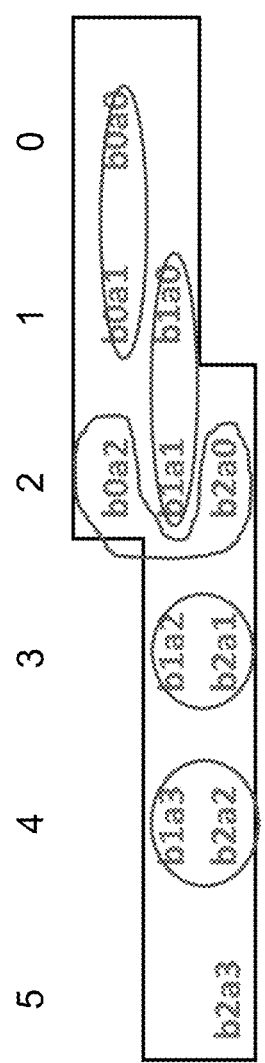
Figure 11D:
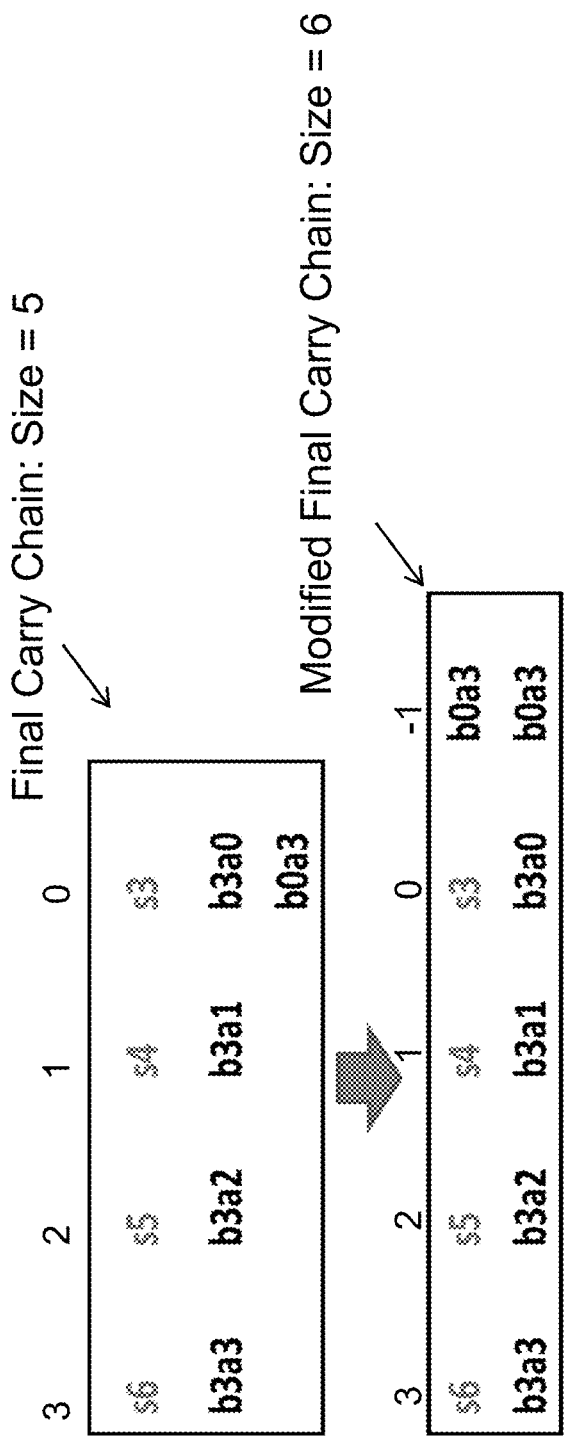

FIG. 11C illustrates a revised cell mapping for the first carry chain where a first cell of type 1 is used to generate partial product bit b0$a$0 for column 0 and partial product bit b0$a$1 for a subsequent column, column 1. A second cell of type 1 is used to generate partial product bit a0$b$1 for column 1 and partial product bit b1$a$1 from a subsequent column, column 2. A first cell of type 2 is used to sum partial product bits a2$b$0, b2$a$0, and b1$a$1 for column 2. A second cell of type 2 is used to sum partial product bits b1$a$2 and b2$a$1 for column 3. A third cell of type 2 is used to sum partial product bits b1$a$3 and b2$a$2 for column 4. By combining the cell of type 1 with the cell of type 2 in column, the circuit implements three partial product bits for column 2 without requiring a second and third carry chain.

With reference to 1040, 1060, and 1080, it is determined that column 0 of the final carry chain has three addends that require more than 4 inputs to sum s3, b3$a$0, and b0$a$3. Since the cell assigned for processing the partial product bits in column 0 of the final carry chain does not support the assigned inputs, and column 0 corresponds to the least significant bit of the carry chain (a first column), the technique used with reference to FIG. 8 may not be used. Instead, 1080 discloses a solution where an extra column, labeled "−1" in FIG. 11 D, is introduced to the right of the least significant bit column, and where one of the addends from column 0 is moved into the new −1 column. According to an embodiment of the present disclosure, instead of adding a cell to the final carry chain to implement the extra column −1, the cell corresponding to the most significant bit of the first carry chain may be used to pack the features required to implement the extra column −1.

Figure 12B:
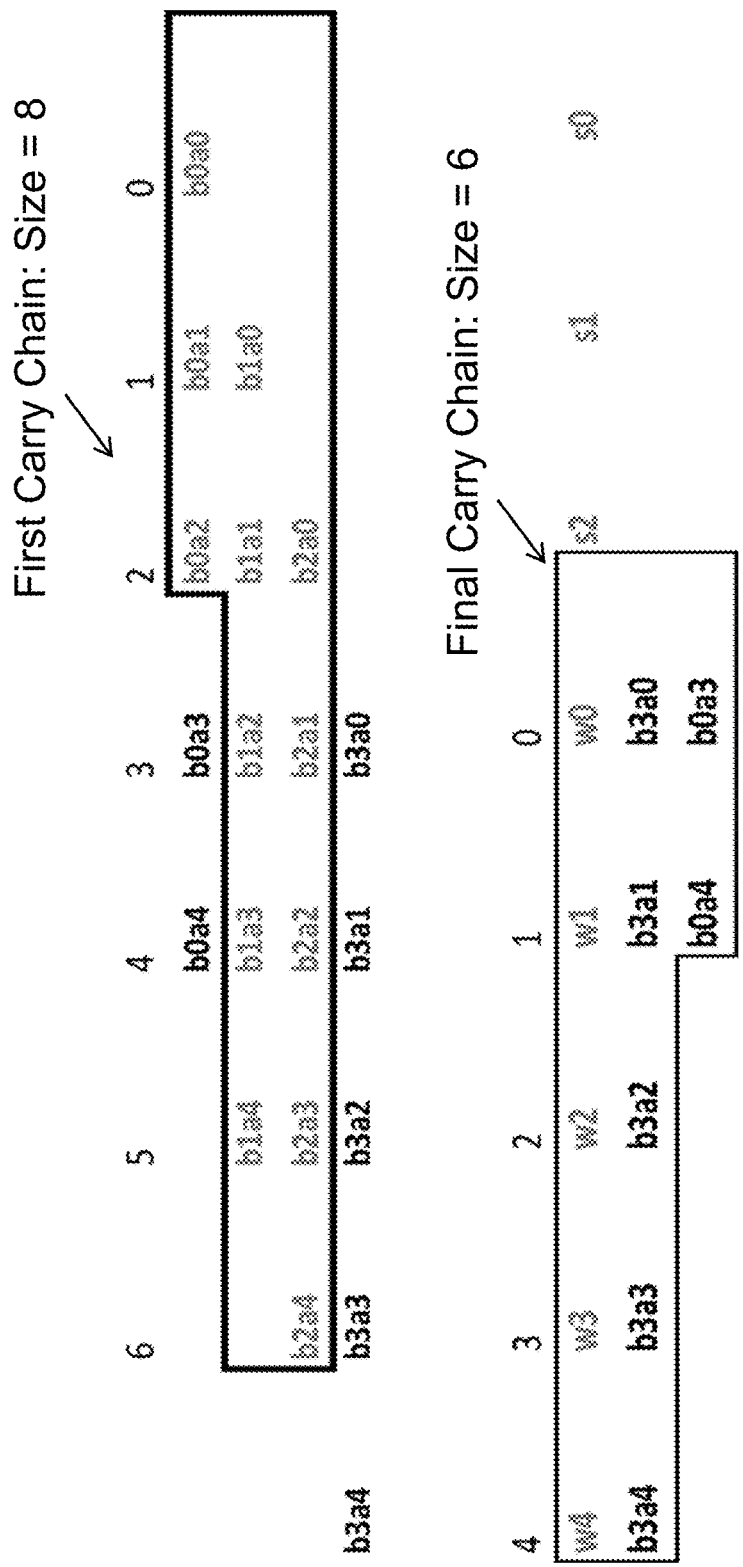
Figure 12C:
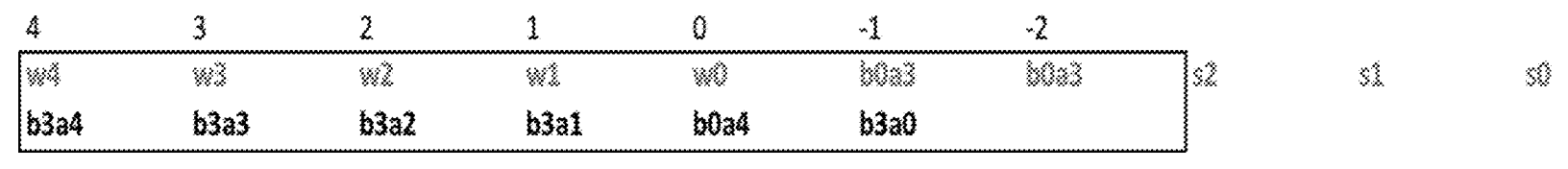

FIGS. 12A-12C illustrate an example and cell arrangement of adding earlier columns to a carry chain to generate addends to reduce a number of carry chains according to an embodiment of the present disclosure. The carry chains may be implemented by and referred to as a chain of PLD cells. In this example, an unsigned 5×4 multiplier calculates a product of a 5-bit unsigned number and a 4-bit unsigned number {a4, a3, a2, a1, a0} * {b3, b2, b1, b0}. With reference to 1010 (shown in FIG. 10), partial product bits to be computed and a manner in which the partial product bits are to be summed to generate a final product are identified by generating a multiplication table. FIG. 12A illustrates a multiplication table that includes an array of partial product bits ("partial product array"). Each column of the multiplication table includes one or more partial product bits to be summed to generate a final product that represents the product of the 5×4 multiplier. As shown there are 8 columns, columns 0-7, where column 0 at the right end of the multiplication table represents the least significant bit, and column 7 at the left end of the multiplication table represents the most significant bit.

With reference to 1020 (shown in FIG. 10), carry chains and cells in the carry chains on a target device are assigned for generating and summing the partial product bits. FIG. 12B illustrates a mapping of the 5×4 multiplier according to an exemplary embodiment of the present disclosure. As shown, a first carry chain of size 8 is used to sum up to 3 partial product bits from each of columns 0-6 of the multiplication table shown in FIG. 12A. A final carry chain of size 6 is used to sum some of the results of the first carry chain and remaining partial product bits. Terms s0-s2 and w0-w4 represent the results generated from the first carry chain. It should be appreciated that the computation performed at each column of a carry chain, generating the partial product bits and summing the partial product bits, is intended to be performed by a cell on the target device. As such, the first carry chain of size 8 is implemented by 8 cells, and the final carry chain of size 6 is implemented by 6 cells.

With reference to 1030 (shown in FIG. 10), the assigned cells are evaluated to determine whether they have a larger number of inputs assigned to them than is supported. In this example, each of the cells in the carry chain supports 4 inputs and a shared arithmetic mode.

With reference to 1040, 1060, and 1070, it is determined that column 2 of the first carry chain requires 6 inputs to sum partial product bits b0$a$2, b1$a$1, and b2$a$0. Since the cell assigned for processing the partial product bits in column 2 of the first carry chain does not support the assigned inputs, and column 2 does not correspond to the least significant bit of the carry chain, the technique described with reference to FIG. 8 where a first type of cell and the second type of cell are utilized to sum the partial product bits of cells having a larger number of inputs than are supported. The methodology described with reference to FIGS. 11B and 11C can be utilized here.

With reference to 1040, 1060, and 1080, it is determined that both columns 0 and 1 of the final carry chain have three addends that require more than 4 inputs to sum w0, b3$a$0, and b0$a$3, and to sum w1, b3$a$1, and b0$a$4. Since the cells assigned for processing the partial product bits in columns 0 and 1 of the final carry chain do not support the assigned inputs, and columns 0 and 1 correspond to the least significant bit and the second to least significant bit of the carry chain (a first and second column), the technique used with reference to FIG. 8 may not be used. Instead, 1080 discloses a solution where extra columns, labeled "−1" and "−2" in FIG. 12C, are introduced to the right of the least significant bit column. Two addends are moved to columns "−1" and "−2". The SHAREIN and CIN connections are used to deliver these addends to the least significant bit column.

Figure 12D:
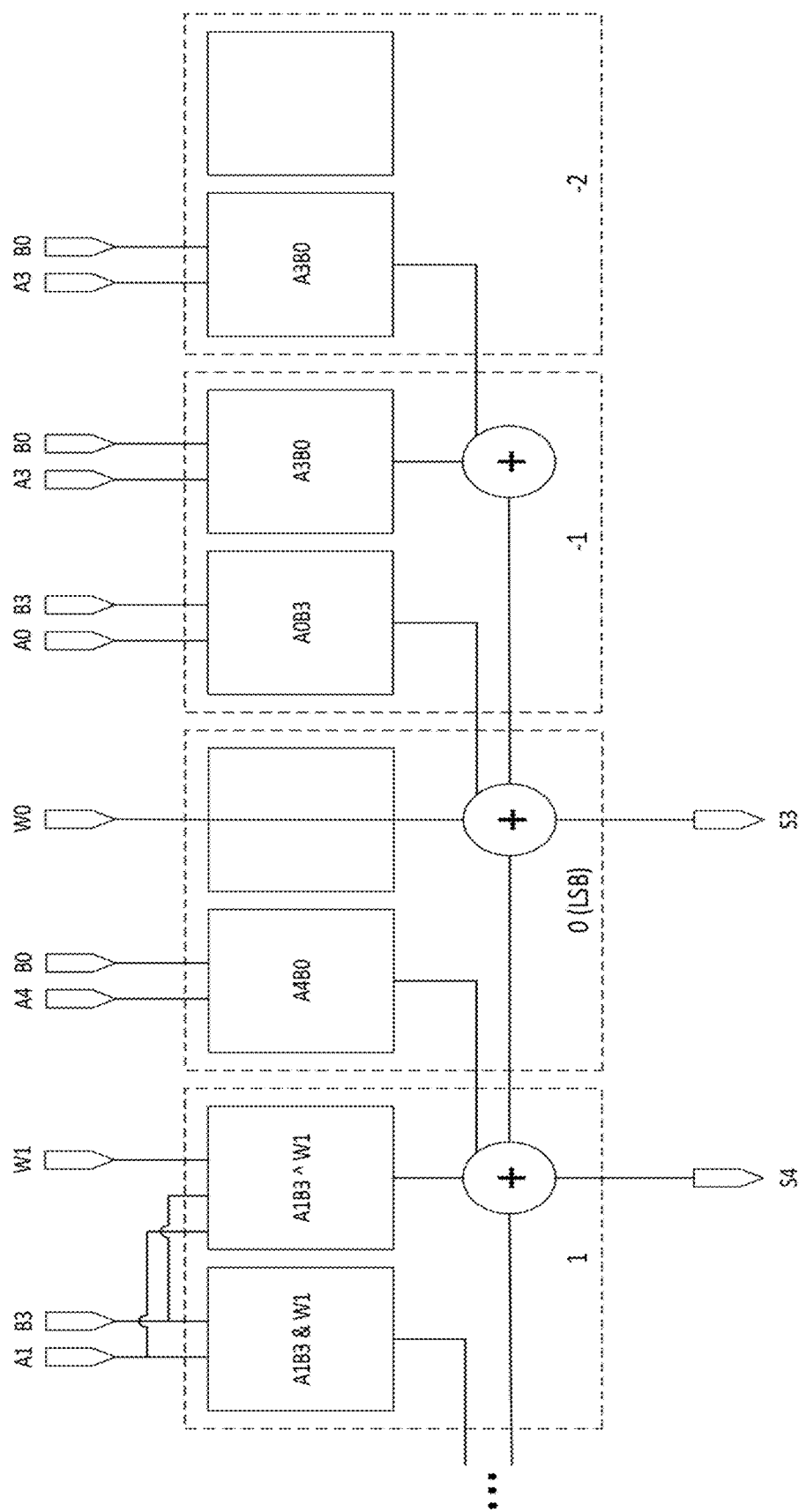

FIG. 12D illustrates a portion of the adder chain which includes the least significant bit of the adder chain and new cells corresponding to columns "−1" and "−2". Note that partial product bit a3$b$0 is calculated in both columns "−1" and "−2" in order to send it through CIN connections. Cells "1" and "−2" do not use SUMOUT outputs and may be packed together with two most significant bits cells of the first carry chain, and where one of the addends from column 0 is moved into the new −1 column.

Figure 13F:
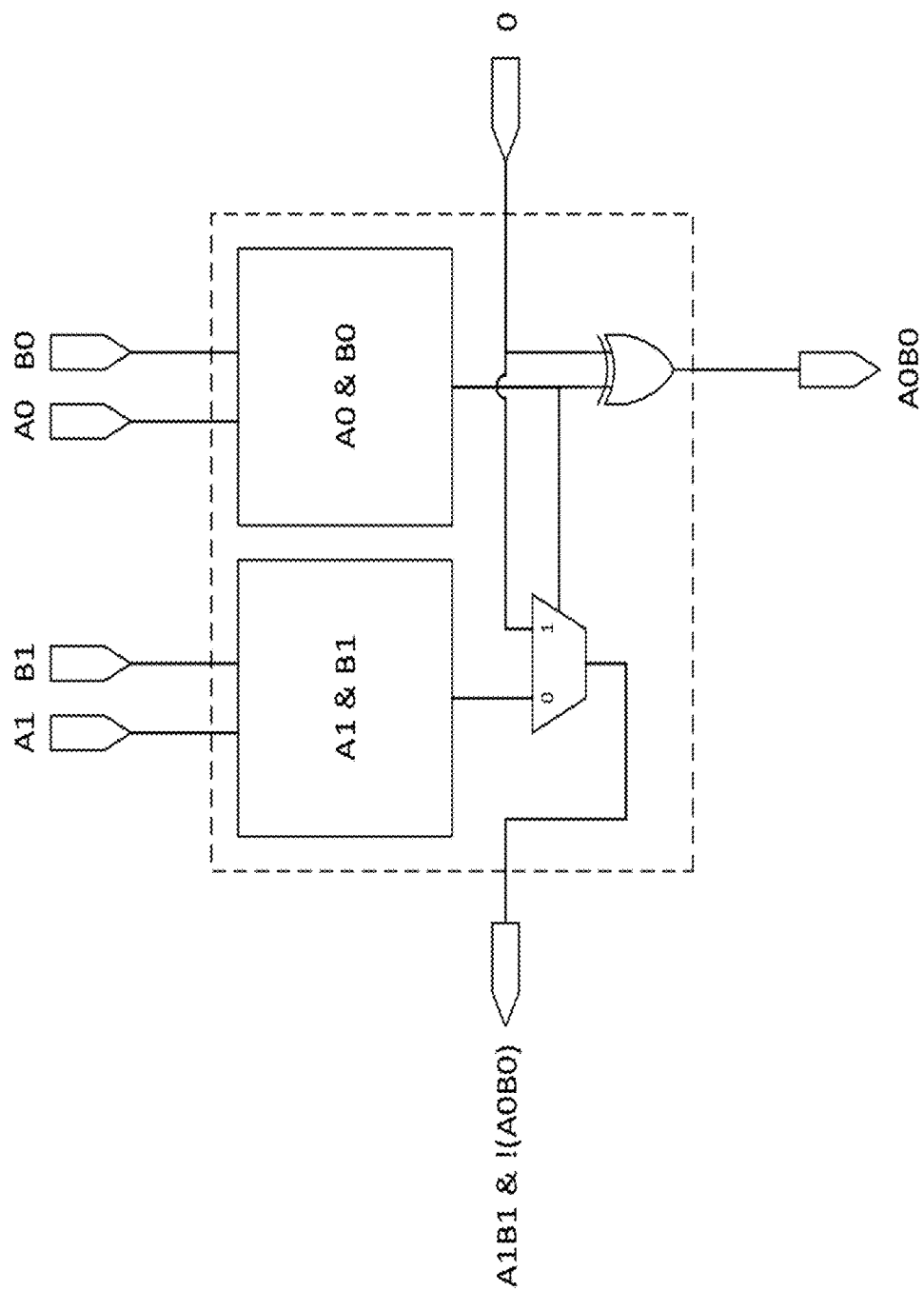

FIGS. 13A-13H illustrate an example and cell arrangement of calculating partial product bits for subsequent columns of an adder to reduce a number of carry chains using cells that do not support a shared arithmetic function according to an embodiment of the present disclosure. The carry chains may be implemented by and referred to as a chain of PLD cells. It should be appreciated that the example and cell arrangement described with reference to FIGS. 13A-13H may be used to implement procedure 540 illustrated in FIG. 5. In this example, an unsigned 3×3 multiplier calculates a product of two 3-bit unsigned numbers {a2, a1, a0} * {b2, b1, b0}. FIG. 13A illustrates a multiplication table that identifies partial product bits to be computed and a manner in which the partial product bits are to be summed to generate a final product are identified. Each column of the multiplication table includes one or more partial product bits to be summed to generate a final product that represents the product of the 3×3 multiplier. As shown there are 5 columns, columns 0-4, where column 0 at the right end of the multiplication table represents the least significant bit, and column 5 at the left end of the multiplication table represents the most significant bit.

FIG. 13B illustrates a mapping of the 3×3 multiplier where carry chains and cells in the carry chain are assigned. As shown, a first carry chain of size 5 is used to sum up to 2 partial product bits from each of columns 0-4 of the multiplication table shown in FIG. 13A. A final carry chain of size 4 is used to sum some of the results of the first carry chain and remaining partial product bits. Terms s0-s4 represent the results generated from the first carry chain. It should be appreciated that the computation performed at each column of a carry chain, generating the partial product bits and summing the partial product bits, is intended to be performed by a cell on the target device. As such, the first carry chain of size 5 is implemented by 5 cells, and the final carry chain of size 4 is implemented by 4 cells.

As described with reference to FIGS. 8, and 9A-9C, this type of multiplier could be modified to be implemented by a more efficient single carry chain of length 6 if the cells available supported a shared arithmetic mode. However, if a shared arithmetic mode is not available, alternative modifications can be made to the multiplier mapping.

A first optimization of the partial product bits in the multiplication table is performed where the partial product bits in column 1 of the multiplication table illustrated in FIG. 13A, a0b1 and a1b0, are added using a half adder. The result is illustrated in FIG. 13C.

A second optimization of the partial product bits in the multiplication table is performed where the partial product bits in column 2 of the multiplication table illustrated in FIG. 13B, a1b1 and a0b1a1b0, are added using a half adder. The result is illustrated in FIG. 13D. As shown a0b1a1b0^a1b1=a1b1 & !(a0b0), and a0b1a1b0 & a1b1=a1b1a0b0.

A third optimization of the partial product bits in the multiplication table is performed where columns 0 and 1 are swapped. The result is illustrated in FIG. 13E. This is permitted because only one entry is present in each column, so there is no carry generated.

FIG. 13F illustrates a cell configured to implement a SUMOUT=a0b0, and COUT=a1b1 & !(a0b0). This cell configuration may be used to implement a column of height 3 (having 3 addends). The least significant bit column of the second chain includes 5 inputs which exceeds the maximum number of data inputs of a cell, which is 4 in this example.

To address this issue, the procedures described with reference to FIGS. 10, and 11A-11D may be utilized, where one of the least significant bit addends is moved into a new "−1" column.

Figure 13G:
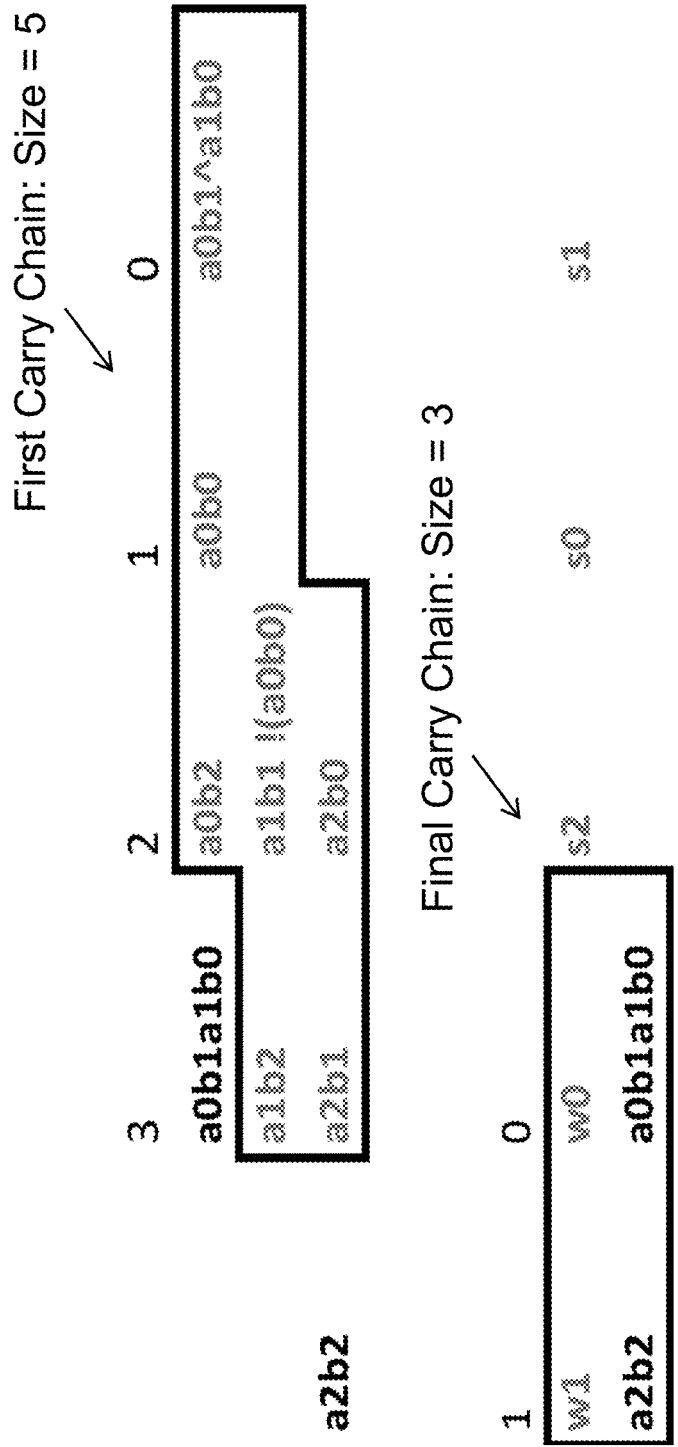

FIG. 13G illustrates a modified mapping of the 3×3 multiplier where carry chains and cells in the carry chain are assigned. The second carry chain has a length reduced from 4 to 3. Utilizing the procedure described, the total number of cells in the multiplier is reduced from 9 to 8.

Figure 13H:
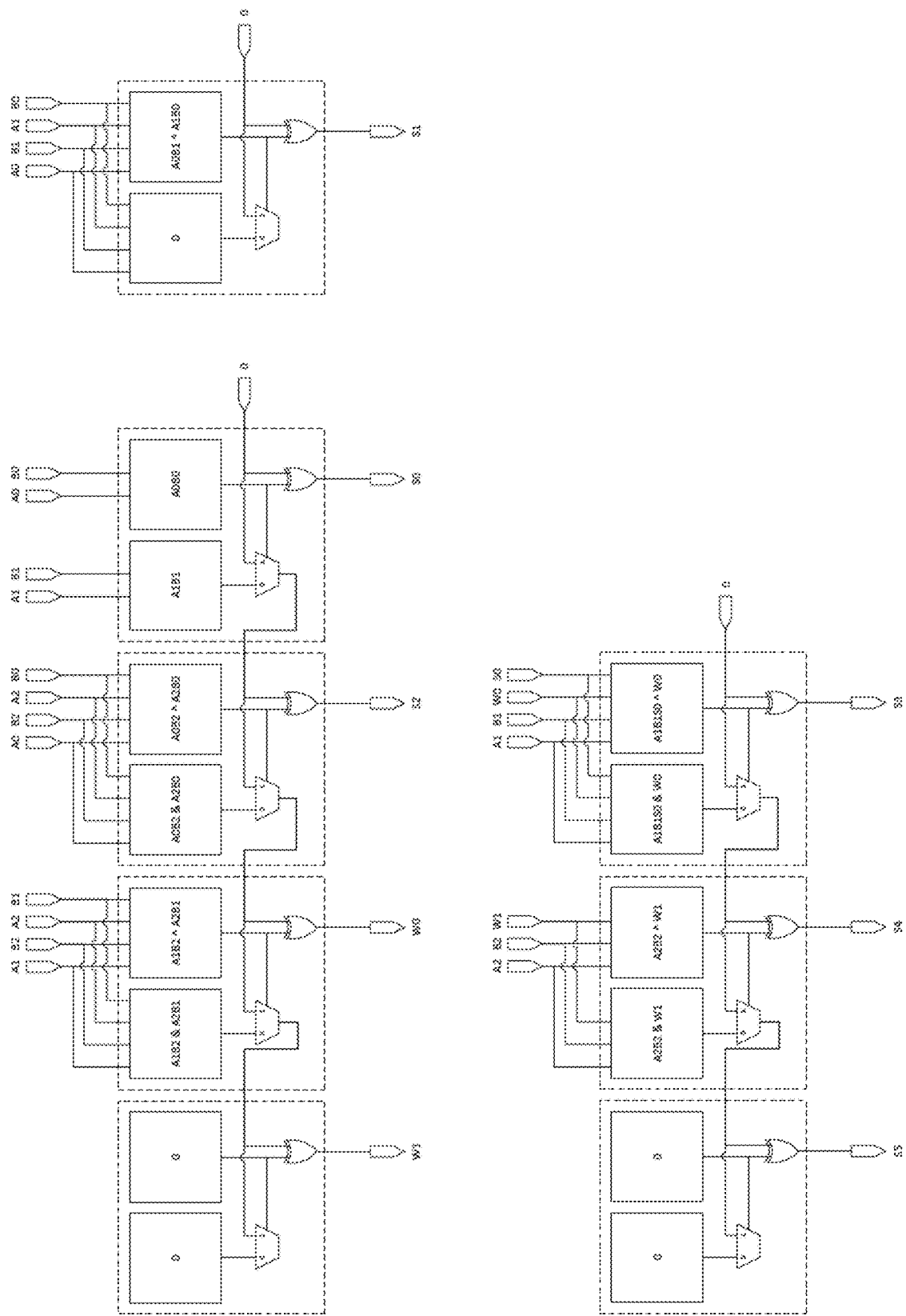

FIG. 13H illustrates a cell arrangement for a 3×3 multiplier using cells that do not support a shared arithmetic function according to an embodiment of the present disclosure.

According to an embodiment of the present disclosure, a target device that includes logic cells such as that shown in FIG. 3B may implement the following N-bit expression Z=A&B+C&D+E using N ALMs connected in a carry chain. The i-th LUT5 1 implements A[i]&B[i]^C[i]&D[i]^E[i]. The i-th LUT 5 2 implements maj(A[i]&B[i], C[i]&D[i], E[i]). This is a useful for multiplier design. When building an {N−2}×{M−2} multiplier with K ALMs, using a A&B+C&D+E expression, an N×M multiplier can be built with K+N+M−0.5 ALMs.

For a 2×2 multiplier, carry chains are not needed. The a 2×2 multiplier may be implemented using 4 LUT 5 in combinational mode.

Figure 14B:
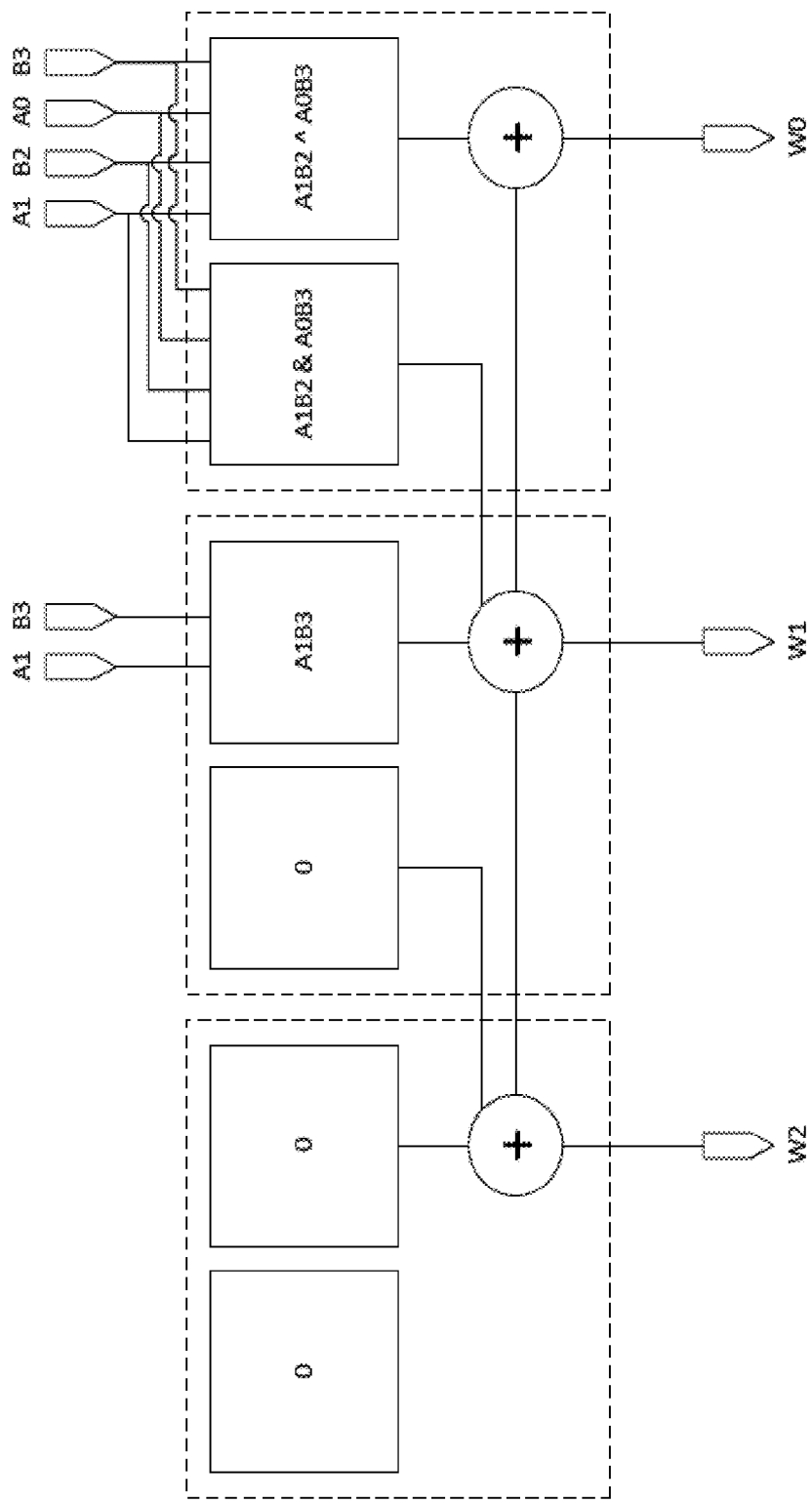
Figure 14C:
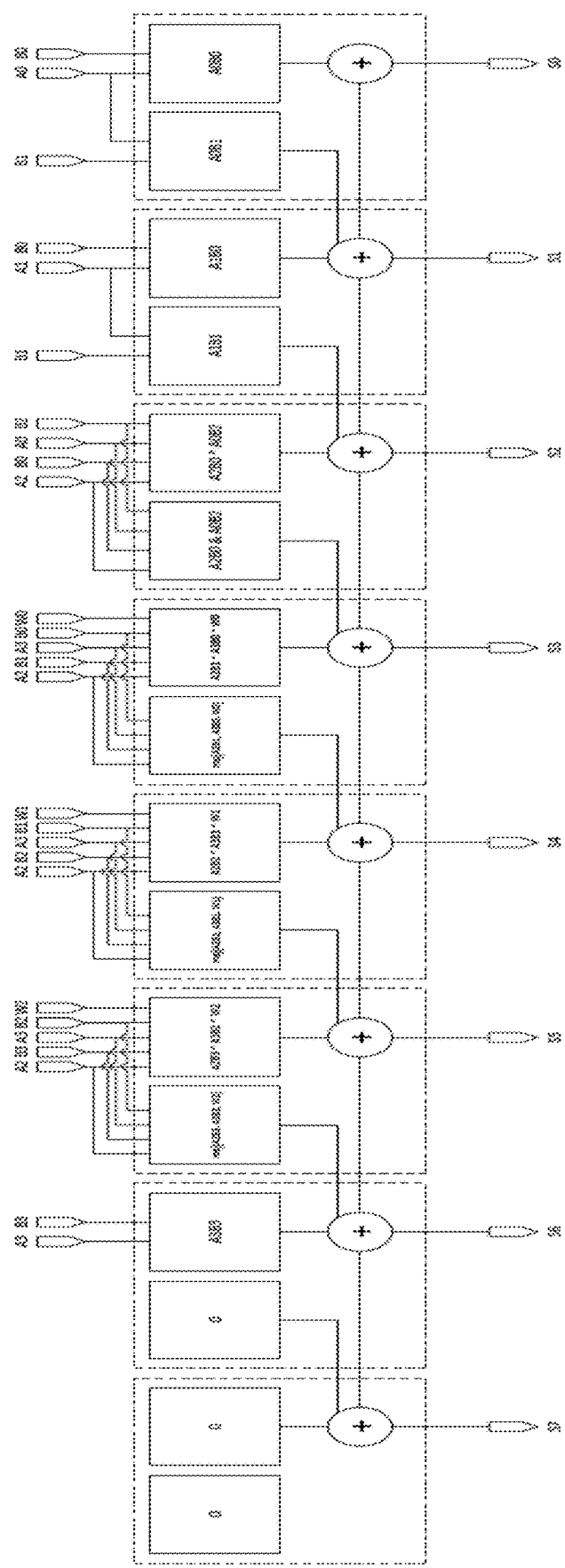

FIG. 14A illustrates an example of mapping a 4×4 multiplier according to an embodiment of the present disclosure. For a 4×4 multiplier, a two stage architecture may be utilized. Stage 1 illustrates a multiplication table that identifies partial product bits to be computed and a manner in which the partial product bits are to be summed to generate a final product. Each column of the multiplication table includes one or more partial product bits to be summed to generate a final product that represents the product of the 4×4 multiplier. During stage 1, only the sums of the underlined partial product bits are computed. During stage 2 the A&B+C&D+E expression is utilized, where E is the output of the first stage. The least significant bit, b0a0, can be implemented separately using a single LUT5. A single PLD cell may be used to sum up three bits if two of those bits are partial product bits (A&B, C&D), while the third bit is a "simple" bit. This is shown, for example, at stage 2 in FIG. 14A. A single chain of PLD cells may be used to perform a final summation, even though in Stage 2 there are three levels of bits. For example one of the PLD cells in that chain will sum up bits (b0a3, b1a2, w0). FIGS. 14B-C illustrate a cell arrangement for the 4×4 multiplier.

Figure 15:
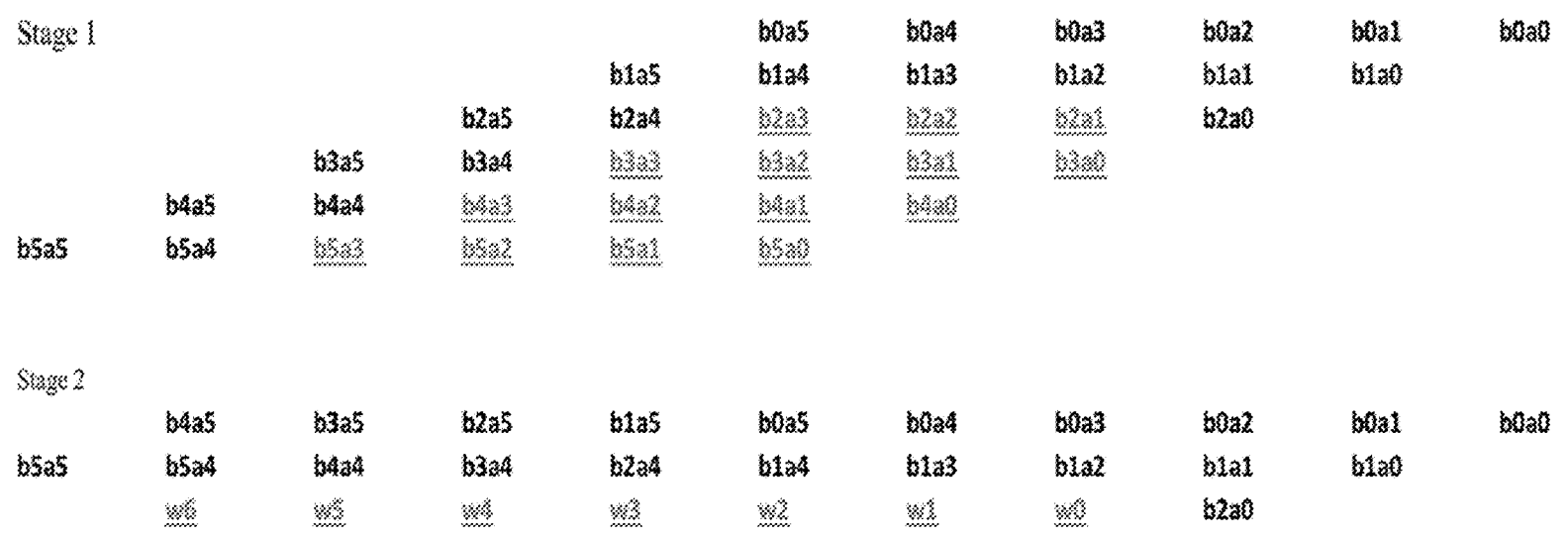

FIG. 15 illustrates an example of mapping a 6×6 multiplier according to an embodiment of the present disclosure. For a 6×6 multiplier, a two stage architecture may also be used. During stage 1, only the sums of the underlined partial product bits are computed. This is essentially a 4×4 subdesign. During stage 2, the A&B+C&D+E block is used, where E is the output of the first stage. The least significant bit b-a can be implemented separately using a single LUT5.

FIGS. 4-6, 8, and 10 are flow charts that illustrate embodiments of the present disclosure. The procedures described in these figures may be performed by an EDA tool implemented by a computer system. Some of the techniques illustrated may be performed sequentially, in parallel or in an order other than that which is described and that the procedures described may be repeated. It is appreciated that not all of the techniques described are required to be performed, that additional techniques may be added, and that some of the illustrated techniques may be substituted with other techniques.

Figure 16:
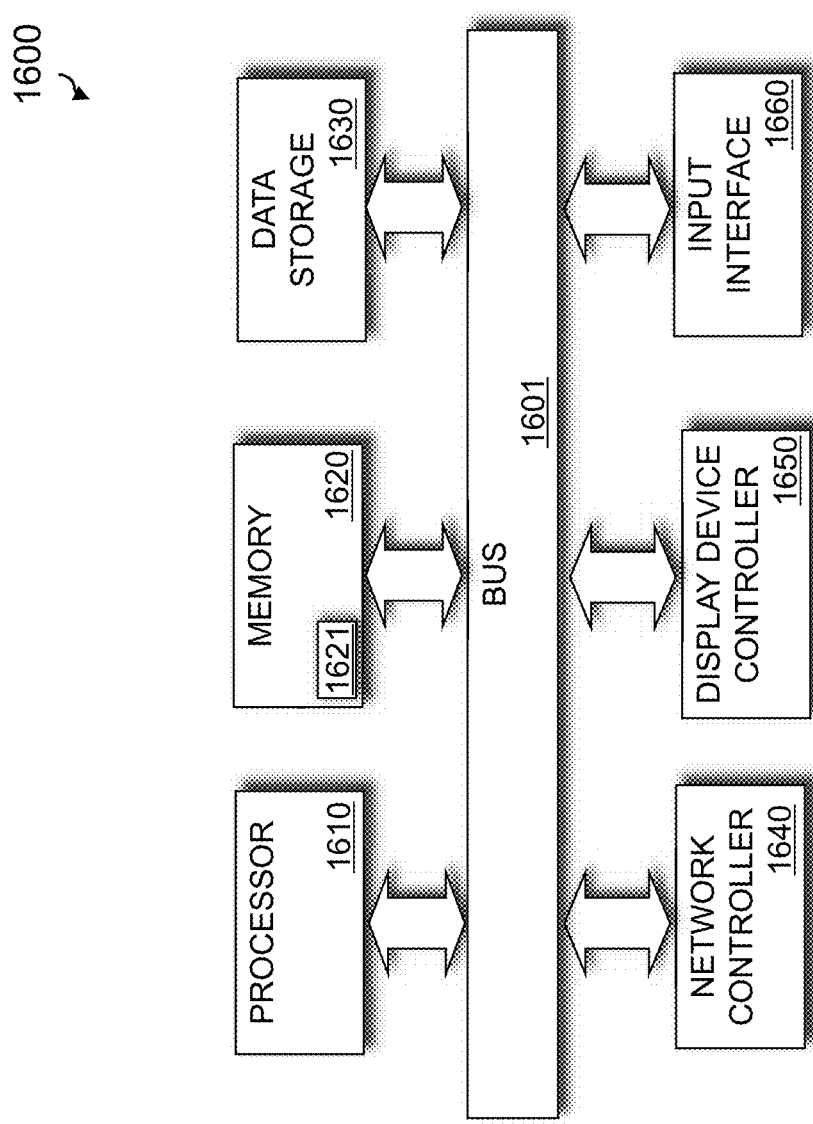
FIG. 16 is a block diagram of an exemplary computer system in which an example embodiment of the present disclosure resides.

FIG. 16 is a block diagram of an exemplary computer system 1600 in which an example embodiment of the present disclosure resides. The computer system 1600 includes a processor 1610 that process data signals. The processor 1610 is coupled to a bus 1601 or other switch fabric that transmits data signals between processor 1610 and other components in the computer system 1600. The computer system 1600 includes a memory 1620. The memory 1620 may store instructions and code represented by data signals that may be executed by the processor 1610. A data storage device 1630 is also coupled to the bus 1601.

A network controller 1640 is coupled to the bus 1601. The network controller 1640 may link the computer system 1600 to a network of computers (not shown) and supports communication among the machines. A display device controller 1650 is coupled to the bus 1601. The display device controller 1650 allows coupling of a display device (not shown) to the computer system 1600 and acts as an interface between the display device and the computer system 1600. An input interface 1660 is coupled to the bus 1601. The input interface 1660 allows coupling of an input device (not shown) to the computer system 1600 and transmits data signals from the input device to the computer system 1600.

A system designer 1621 may reside in the memory 1620 and be executed by the processor 1610. The system designer 1621 may operate to perform design generation, synthesis, placement, routing, timing analysis, and assembly on a design for the system. According to an embodiment of the present disclosure, during synthesis, the system designer 1621 may perform multiplier regularization as described with reference to FIGS. 4-15.

Figure 17:
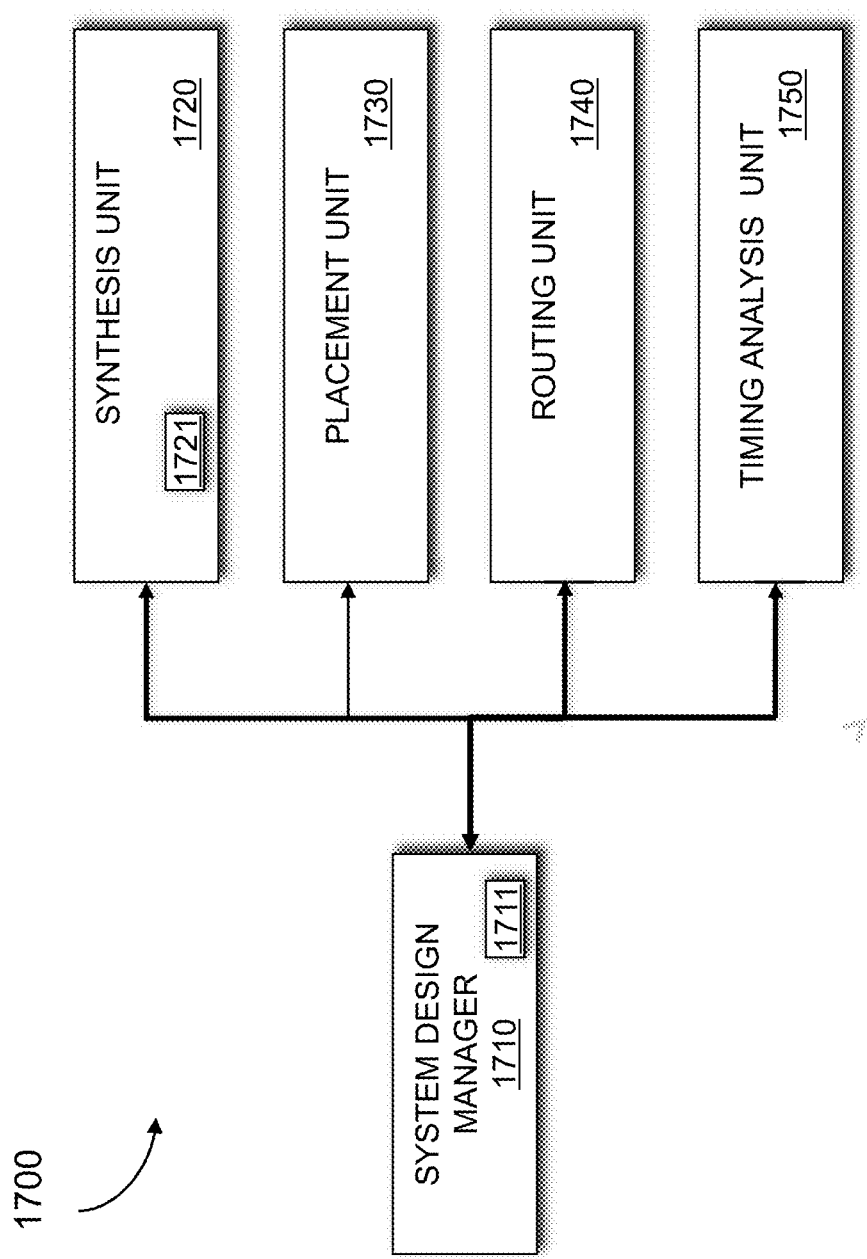
FIG. 17 illustrates a system designer according to an embodiment of the present disclosure.

FIG. 17 illustrates a system designer 1700 according to an embodiment of the present disclosure. The system designer 1700 may be an EDA tool for designing a system on a target device such as an FPGA, application-specific integrated circuit (ASIC), structured ASIC, or other circuitry. FIG. 17 illustrates modules implementing an embodiment of the system designer 1700. According to one embodiment, the modules represent software modules and system design may be performed by a computer system such as the one illustrated in FIG. 15 executing sequences of instructions represented by the modules shown in FIG. 16. Execution of the sequences of instructions causes the computer system to support system design as will be described hereafter. In alternate embodiments, hard-wire circuitry may be used in place of or in combination with software instructions to implement embodiments of present disclosure. Thus, embodiments of present disclosure are not limited to any specific combination of hardware circuitry and software. The system designer 1700 includes a system designer manager 1710. The system designer manager 1710 is connected to and transmits data between the components of the system designer 1700. The system design manager 1710 includes a design generation unit 1711. According to an embodiment of the present disclosure, the design generation unit 1711 generates a design in response to input provided by a user. In this embodiment, the user may input a register-transfer-level (RTL) description of the system, select and connect logic from a design library, or utilize other design input options. Alternatively, the input provided by the user may be a computer language description of the system. In this embodiment, a high-level compilation of the computer language description of the system is performed. The design for the system generated may be in HDL.

The system designer 1700 includes a synthesis unit 1720. The synthesis unit 1720 takes a conceptual HDL design definition and generates an optimized logical representation of the system. The optimized logical representation of the system generated by the synthesis unit 1720 may include a representation that has a reduced number of functional blocks and registers, such as logic gates and logic elements, required for the system. Alternatively, the optimized logical representation of the system generated by the synthesis unit 1720 may include a representation that has a reduced depth of logic and that generates a lower signal propagation delay.

The synthesis unit 1720 also performs technology mapping. Technology mapping involves determining how to implement the functional blocks and registers in the optimized logic representation utilizing specific resources such as cells on a target device thus creating an optimized "technology-mapped" netlist. The technology-mapped netlist illustrates how the resources (cells) on the target device are utilized to implement the system. In an embodiment where the target device is an FPGA, the technology-mapped netlist may include cells such as logic array blocks (LABs), registers, memory blocks, digital signal processing (DSP) blocks, input output (TO) elements or other components.

The synthesis unit 1720 includes a multiplication regularization unit 1721. According to an embodiment of the present disclosure, the multiplication regularization unit 1721 determines how to implement multipliers in the system with specific resources on the target device. The multiplication regularization unit 1721 performs one or more multiplier regularization procedures during synthesis. Multiplier density is improved by performing factorizations of multipliers, and leveraging new uses of available LUT modes. It should be appreciated that the multiplication regularization unit 1721 may perform any one or more of the procedures described with reference to FIGS. 4-15.

The system designer 1700 includes a placement unit 1730 that processes the optimized technology-mapped netlist to produce a placement for each of the functional blocks. The placement identifies which components or areas on the target device are to be used for specific functional blocks and registers.

The system designer 1700 includes a routing unit 1740 that determines the routing resources on the target device to use to provide interconnection between the components implementing functional blocks and registers of the logic design.

The system designer 1700 includes a timing analysis unit 1750 that performs timing analysis to determine whether timing constraints of the system are satisfied.

The system designer manager 1710 includes an assembly unit 1711 that may perform an assembly procedure that creates a program file that includes the design of the system. The program file (configuration file) may be a configuration bit stream that may be used to program (configure) a target device. In the case of an ASIC, the program file may represent the physical layout of the circuit. According to an embodiment of the present disclosure, the system designer 1100 may be implemented by an EDA tool executed on a first computer system. The program file generated may be transmitted to a second computer system to allow the design of the system to be further processed. The program file may be transmitted from either the first or second computer system onto the target device and used to program the target device according to the system design. It should be appreciated that the design of the system may also be output in other forms such as on a display device or other medium. The target device may be programmed with the program file. By programming the target with the program file, components (programmable resources) on the target device are physically transformed to implement the system.

It should be appreciated that embodiments of the present disclosure may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

The following examples pertain to further embodiments. In one embodiment, a method for implementing a multiplier on a programmable logic device (PLD) includes identifying partial product bits of the multiplier and how the partial product bits are to be summed to generate a final product from a multiplier and multiplicand. Chains of PLD cells and cells in the chains of PLD cells are assigned for generating and summing the partial product bits. It is determined whether a bit in an assigned cell in an assigned chain of PLD cells is under-utilized. In response to determining that the bit is under-utilized, the assigning of the chains of PLD cells and cells for generating and summing the partial product bits are changed to improve an overall utilization of the chains of PLD cells and cells in the chains of PLD cells.

In a further embodiment, the method wherein changing the assigning of the chains of PLD cells and the cells comprise moving the partial product bits to be summed from a chain of PLD cells to another chain of PLD cells that is lower in order.

In a further embodiment, the method wherein changing the assigning of the chains of PLD cells and the cells comprises utilizing a half adder.

In a further embodiment, the method wherein for a sum of two bits, the half adder performs an exclusive OR operation to generate a least significant bit of the sum of the two bits, and performs an AND operation to generate a most significant bit of the sum of the two bits.

In a further embodiment, the method wherein improving the overall utilization shortens a length of one of the chains of PLD cells by reducing a number of cells required.

In a further embodiment, the method further comprising not increasing a length of the chains of PLD cells assigned.

In a further embodiment, the method wherein identifying comprises generating a multiplication table where a number of chains of PLD cells and a number of cells in each of the chains of PLD cells are determined.

In a further embodiment, the method further comprising generating a data file that describes the multiplier, and programming the programmable logic device with the data file to physically transform components on the programmable logic device to implement the multiplier.

In a further embodiment, a multiplier implemented on a programmable gate array that includes a first chain of PLD cells that generates a first plurality of partial product bits and that sums the first plurality of partial product bits to generate a first plurality of results. The multiplier also includes a second chain of PLD cells that generates a second plurality of partial product bits and that sums the second plurality of partial product bits to generate a second plurality of results. The multiplier also includes a third chain of PLD cells that sums the first plurality of results generated from the first chain of PLD cells and the second plurality of results from the second chain of PLD cells, that sums a partial product bit outside the first and second chain of PLD cells with a result of an XOR between one of the first plurality of results generated from the first chain of PLD cells and one of the first plurality of results generated from the second chain of PLD cells, and that sums a second of the second plurality of results generated from the second chain of PLD cells and a result of an AND between the one of the first plurality of results generated from the first chain of PLD cells and the one of the first plurality of results generated from the second chain of PLD cells that allows the third chain of PLD cells to generate a product.

In a further embodiment, a method for implementing a multiplier on a programmable logic device (PLD) includes identifying partial product bits of the multiplier and how the partial product bits are to be summed to generate a final product from a multiplier and multiplicand, wherein the partial product bits to be summed are arranged together in a column of a multiplication table. Chains of PLD cells and cells in the chains of PLD cells on the PLD are assigned for generating and summing the partial product bits, wherein each cell is assigned to sum together partial product bits in its assigned column. It is determined whether a number of inputs for a cell designated for summing a column of partial product bits exceeds input capabilities of the cell. In response to determining that the number of inputs for the cell exceeds the input capabilities of the cell, a first cell is configured to calculate a first partial product bit for a first column in a chain of PLD cells and a second partial product bit for a subsequent column in the chain of PLD cells. A second cell is configured to compute the sum of a value generated from one or more partial product bits for the subsequent column and the second partial product bit from the first cell.

In a further embodiment, the method wherein the first cell supports a shared arithmetic mode that allows it to transmit a value computed by a look up table (LUT) to an input of the second cell.

In a further embodiment, the method wherein determining whether a number of inputs for the cell designated for summing the column of partial product bits exceeds the input capabilities of the cell comprises comparing a number of total inputs associated with partial product bits associated with the column with a number of inputs supported by the cell.

In a further embodiment, the method wherein configuring the first cell comprises setting a first look up table (LUT) to generate a first partial product bit for the first column, and setting a second LUT to generate a second partial product bit for the subsequent column.

In a further embodiment, the method wherein configuring the second cell comprises transmitting the second partial product bit received from the first cell to an adder on the second cell, and transmitting the value to the adder on the second cell.

In a further embodiment, the method wherein the value comprises a least significant bit of a sum of two partial product bits.

In a further embodiment, the method wherein the least significant bit of the sum of the two partial product bits is computed by XORing the two partial product bits.

In a further embodiment, the method further comprising configuring the second cell to generate a second value that represents a most significant bit of the sum of the two partial product bits.

In a further embodiment, the method wherein the most significant bit of the sum of the two partial product bits is computed by performing an AND function on the two partial product bits.

In a further embodiment the method further comprising generating a data file that describes the multiplier, and programming the programmable logic device with the data file to physically transform components on the programmable logic device to implement the multiplier.

In a further embodiment, a multiplier implemented on a programmable gate array that includes a first cell that calculates a first partial product bit for a current column in the multiplier and a second partial product bit for a subsequent column in the multiplier, a second cell that computes the sum of a first value generated from one or more partial product bits for the subsequent column and the second partial product bit from the first cell.

In a further embodiment, a method for implementing a multiplier on a programmable logic device (PLD) that includes identifying partial product bits of the multiplier and how the partial product bits are to be summed to generate a final product from a multiplier value and multiplicand, wherein the partial product bits to be summed are arranged together in a column of a multiplication table. Chains of PLD cells and cells in the chains of PLD cells on the PLD are assigned for generating and summing the partial product bits, wherein each cell is assigned to sum together partial product bits in its assigned column. It is determined whether a number of inputs for a cell designated for summing a column of partial product bits exceeds input capabilities of the cell. In response to determining that the number of inputs for the cell exceeds the input capabilities of the cell, determining whether the column of partial product bits corresponds to a least significant bit of the chains of PLD cells of the multiplier. In response to determining that the column of partial product bits corresponds to the least significant bit of the chains of PLD cells, a new bit is added prior to the least significant bit of the chains of PLD cells and moving one of the partial product bits from the column of partial product bits into a new column of partial product bits that corresponds to the new bit.

In a further embodiment, the method further comprising assigning a new cell to support the new column wherein the new cell supports a shared arithmetic mode that allows it to transmit a value computed by a look up table (LUT) to an input of a subsequent cell in the chains of PLD cells.

In a further embodiment, the method further comprising determining whether a number of inputs for a second cell designated for summing a second column of partial product bits exceeds the input capabilities for the second cell.

In a further embodiment, the method further comprising in response to determining that the number of inputs for the second cell exceeds the input capabilities of the second cell, determining whether the second column of partial product bits corresponds to a second to least significant bit of the chains of PLD cells of the multiplier.

In a further embodiment, the method further comprising in response to determining that the second column of partial product bits corresponds to the second to least significant bit of the chain of PLD cells, adding a second new bit two positions prior to the least significant bit of the chain and moving one of the partial product bits from the column of partial product bits into a second new column of partial product bits that corresponds to the second new bit.

In a further embodiment, the method further comprising moving another of the partial product bits from the column of partial product bits into the new column of partial product bits that corresponds to the new bit.

In a further embodiment, the method further comprising generating a data file that describes the multiplier, and programming a programmable logic device with the data file to physically transform components on the programmable logic device to implement the multiplier.

In the foregoing specification, embodiments of the disclosure have been described with reference to specific exemplary embodiments thereof. It will, however, be evident that various modifications and changes may be made thereto without departing from the broader spirit and scope of the embodiments of the disclosure. The specification and drawings are, accordingly, to be regarded in an illustrative rather than restrictive sense.

What is claimed is:

1. A method for implementing a multiplier on a programmable logic device (PLD), comprising:
   identifying partial product bits of the multiplier and how the partial product bits are to be summed to generate a final product from a multiplier value and multiplicand, wherein the partial product bits to be summed are arranged together in a column of a multiplication table;
   assigning chains of PLD cells and cells in the chains of PLD cells on the PLD for generating and summing the partial product bits, wherein each cell is assigned to sum together partial product bits in its assigned column;
   determining whether a number of inputs for a cell designated for summing a column of partial product bits exceeds input capabilities of the cell;
   in response to determining that the number of inputs for the cell exceeds the input capabilities of the cell, configuring a first cell to calculate a first partial product bit for a first column in a chain of PLD cells and a second partial product bit for a subsequent column in the chain of PLD cells; and
   configuring a second cell to compute the sum of a value generated from one or more partial product bits for the subsequent column and the second partial product bit from the first cell.

2. The method of claim 1, wherein the first cell supports a shared arithmetic mode that allows the first cell to transmit a value computed by a look up table (LUT) to an input of the second cell.

3. The method of claim 1, wherein determining whether a number of inputs for the cell designated for summing the column of partial product bits exceeds the input capabilities of the cell comprises comparing a number of total inputs associated with partial product bits associated with the column with a number of inputs supported by the cell.

4. The method of claim 1, wherein configuring the first cell comprises setting a first look up table (LUT) to generate the first partial product bit for the first column, and setting a second LUT to generate the second partial product bit for the subsequent column.

5. The method of claim 1, wherein configuring the second cell comprises transmitting the second partial product bit received from the first cell to an adder on the second cell, and transmitting the value to the adder on the second cell.

6. The method of claim 1, wherein the value comprises a least significant bit of a sum of two partial product bits.

7. The method of claim 6, wherein the least significant bit of the sum of the two partial product bits is computed by XORing the two partial product bits.

8. The method of claim 6 further comprising configuring the second cell to generate a second value that represents a most significant bit of the sum of the two partial product bits.

9. The method of claim 8, wherein the most significant bit of the sum of the two partial product bits is computed by performing an AND function on the two partial product bits.

10. The method of claim 1 further comprising:
generating a data file that describes the multiplier; and
programming the programmable logic device with the data file to physically transform components on the programmable logic device to implement the multiplier.

11. A multiplier, comprising:
a first cell that calculates a first partial product bit for a current column in the multiplier and a second partial product bit for a subsequent column in the multiplier in response to determining that a number of inputs for a cell designated for summing a column of partial product bits exceeds input capabilities of the cell; and
a second cell that computes the sum of a first value generated from one or more partial product bits for the subsequent column and the second partial product bit from the first cell.

12. The multiplier of claim 11, wherein the first cell supports a shared arithmetic mode that allows the first cell to transmit a value computed by a look up table (LUT) to an input of the second cell.

13. The multiplier of claim 11, wherein the first cell calculates the first partial product bit and the second partial product bit in response to comparing a number of total inputs associated with partial product bits associated with the column with a number of inputs supported by the first cell.

14. The multiplier of claim 11, wherein a first look up table (LUT) generates the first partial product bit, and a second LUT generates the second partial product bit.

15. The multiplier of claim 11, wherein the first value comprises a least significant bit of a sum of two partial product bits, and wherein the least significant bit of the sum of the two partial product bits is computed by XORing the two partial product bits.

16. The multiplier of claim 11, wherein the first value comprises a least significant bit of a sum of two partial product bits, and wherein the second cell generates a second value that represents a most significant bit of the sum of the two partial product bits.

17. The multiplier of claim 16, wherein the most significant bit of the sum of the two partial product bits is computed by performing an AND function on the two partial product bits.

18. A method for implementing a multiplier on a programmable logic device (PLD), comprising:
identifying partial product bits of the multiplier and how the partial product bits are to be summed to generate a final product from a multiplier value and multiplicand, wherein the partial product bits to be summed are arranged together in a column of a multiplication table;
assigning chains of PLD cells and cells in the chains of PLD cells on the PLD for generating and summing the partial product bits, wherein each cell is assigned to sum together partial product bits in its assigned column;
determining whether a number of inputs for a cell designated for summing a column of partial product bits exceeds input capabilities of the cell;
in response to determining that the number of inputs for the cell exceeds the input capabilities of the cell, determining whether the column of partial product bits corresponds to a least significant bit of the chains of PLD cells of the multiplier; and
in response to determining that the column of partial product bits corresponds to the least significant bit of the chains of PLD cells, adding a new bit prior to the least significant bit of the chains of PLD cells and moving one of the partial product bits from the column of partial product bits into a new column of partial product bits that corresponds to the new bit.

19. The method of claim 18 further comprising assigning a new cell to support the new column wherein the new cell supports a shared arithmetic mode that allows the new cell to transmit a value computed by a look up table (LUT) to an input of a subsequent cell in the chains of PLD cells.

20. The method of claim 18 further comprising determining whether a number of inputs for a second cell designated for summing a second column of partial product bits exceeds the input capabilities for the second cell.

21. The method of claim 20 further comprising in response to determining that the number of inputs for the second cell exceeds the input capabilities of the second cell, determining whether the second column of partial product bits corresponds to a second to least significant bit of the chains of PLD cells of the multiplier.

22. The method of claim 21 further comprising in response to determining that the second column of partial product bits corresponds to the second to least significant bit of the chain of PLD cells, adding a second new bit two positions prior to the least significant bit of the chain and moving one of the partial product bits from the column of partial product bits into a second new column of partial product bits that corresponds to the second new bit.

23. The method of claim 22 further comprising moving another of the partial product bits from the column of partial product bits into the new column of partial product bits that corresponds to the new bit.

24. The method of claim 18 further comprising:
generating a data file that describes the multiplier; and
programming the programmable logic device with the data file to physically transform components on the programmable logic device to implement the multiplier.

* * * * *